United States Patent
Yoshida

(10) Patent No.: US 8,613,222 B2
(45) Date of Patent: *Dec. 24, 2013

(54) DETECTOR, PHYSICAL QUANTITY MEASURING DEVICE, AND ELECTRONIC APPARATUS

(75) Inventor: Naoki Yoshida, Ohbu (JP)

(73) Assignee: Seiko Epson Corporation, Tokyo (JP)

( * ) Notice: Subject to any disclaimer, the term of this patent is extended or adjusted under 35 U.S.C. 154(b) by 317 days.

This patent is subject to a terminal disclaimer.

(21) Appl. No.: 12/862,200

(22) Filed: Aug. 24, 2010

(65) Prior Publication Data

US 2011/0061461 A1 Mar. 17, 2011

(30) Foreign Application Priority Data

Sep. 11, 2009 (JP) ................. 2009-210175

(51) Int. Cl.
*G01C 19/56* (2006.01)

(52) U.S. Cl.
USPC .................... 73/504.12; 73/504.04

(58) Field of Classification Search
USPC ............... 73/504.12, 504.14, 504.16, 504.04
See application file for complete search history.

(56) References Cited

U.S. PATENT DOCUMENTS

| | | | |
|---|---|---|---|
| 4,078,201 A | 3/1978 | Buser | |
| 5,517,845 A * | 5/1996 | Yamashita et al. | 73/1.38 |
| 5,600,253 A | 2/1997 | Cohen et al. | |
| 5,734,087 A * | 3/1998 | Yamashita | 73/1.15 |
| 6,529,015 B2 * | 3/2003 | Nonoyama et al. | 324/678 |
| 6,724,202 B2 | 4/2004 | Tanizawa | |
| 7,870,786 B2 * | 1/2011 | Fukuzawa | 73/504.12 |
| 2008/0111585 A1 | 5/2008 | Fukuzawa | |
| 2008/0111625 A1 | 5/2008 | Fukuzawa | |
| 2010/0066347 A1 | 3/2010 | Nakamura et al. | |
| 2011/0061461 A1 | 3/2011 | Yoshida | |
| 2011/0062941 A1 * | 3/2011 | Yoshida | 324/71.1 |

FOREIGN PATENT DOCUMENTS

| | | |
|---|---|---|
| JP | A-7-218270 | 8/1995 |
| JP | A-11-282502 | 10/1999 |
| JP | A-2000-88578 | 3/2000 |
| JP | A-2002-267452 | 9/2002 |
| JP | A-2004-198310 | 7/2004 |
| JP | A-2006-292469 | 10/2006 |
| JP | A-2006-329637 | 12/2006 |

OTHER PUBLICATIONS

Ishikawa et al., "Second-Order Switched-Capacitor Filter With Reduced Capacitance Spread," Information and Communication Engineers of Japan, Technical Report, pp. 55-62, Mar. 1990 (with translation).
U.S. Appl. No. 12/862,018, filed Aug. 24, 2010 in the name of Naoki Yoshida.
Office Action dated Jan. 17, 2013 issued in U.S. Appl. No. 12/862,018.

* cited by examiner

*Primary Examiner* — Helen Kwok
(74) *Attorney, Agent, or Firm* — Oliff & Berridge, PLC

(57) ABSTRACT

A detector that detects a detection signal corresponding to a driving vibration, which excites a vibrator in an oscillation loop, and a physical quantity to be measured, includes: an amplifying circuit that amplifies a signal corresponding to the driving vibration and the physical quantity; a synchronous detection circuit that detects the amplified signal of the amplifying circuit in synchronization with an oscillation signal in the oscillation loop; an impedance conversion circuit that converts an output impedance of the synchronous detection circuit; a first low pass filter to which an output signal of the impedance conversion circuit is supplied and which outputs a first detection signal; and a second low pass filter to which the output signal of the impedance conversion circuit is supplied and which outputs a second detection signal.

15 Claims, 13 Drawing Sheets

DETECTOR, PHYSICAL QUANTITY MEASURING DEVICE, AND ELECTRONIC APPARATUS

The entire disclosure of Japanese Patent Application No. 2009-210175, filed Sep. 11, 2009 is expressly incorporated by reference herein.

BACKGROUND

1. Technical Field

The invention relates to a detector, a physical quantity measuring device, and an electronic apparatus.

2. Related Art

A sensor circuit which measures a physical quantity, such as angular velocity, has been mounted in a vehicle, an electronic apparatus, and the like in order to detect vibration caused by vehicle movement, hand shaking, and the like. In recent years, as the sensor circuit is used for increasingly varied applications, there is a case where a plurality of outputs is output from a sensor circuit and the physical quantity is measured using each output according to their purposes, for example.

Various sensor circuits which output a plurality of outputs have been proposed. For example, JP-A-2000-88578 discloses an angular velocity sensor that includes two detection means, which detects detection signals with different polarities, and that detects a sensitivity change caused by failure and deterioration by monitoring the detection signals to thereby improve reliability. In addition, JP-A-2006-292469 discloses a capacitance-type physical quantity sensor that includes a first GAIN circuit and a second GAIN circuit, which amplifies the output of the first GAIN circuit and can change the gain at the time of detection of the acceleration and self-diagnosis, and that can perform self-diagnosis of both the output of the first GAIN circuit and the output of the second GAIN circuit simultaneously. In addition, JP-A-2002-267452 discloses a vibration detector that includes a first amplifying means and a second amplifying means with different gains and eliminates the offset of the first amplifying means by the output of the second amplifying means. In addition, JP-A-11-282502 discloses a digital feedback controller that changes the gain according to the amplitude of the output of a sensor so that the resolution of an A/D conversion means is substantially changed. In addition, JP-A-7-218270 discloses a vehicle movement detector which amplifies signals of two piezoelectric elements for detection using a switched capacitor circuit and in which the capacitance ratio of a capacitor, which is connected between the virtual ground end and the output end of an operational amplifier, and an input capacitor is variable. In addition, a second-order switched capacitor filter which is formed by a switched capacitor circuit and suppresses the spread of element values is disclosed in "Second-order SCF which suppresses the spread of element values" by Ishikawa, Anzai, Fujii, the Institute of Electronics, Information and Communication Engineers of Japan, Technical Report CAS89-163//CS89-123// DSP89-62.

Depending on the purpose of a sensor circuit, a wide detection range and high sensitivity need to be compatible. In this case, how to increase the sensitivity on one side by branching of one output of a sensor circuit is considered. In general, however, it is necessary to add a circuit. In this case, since noise increases, it is not possible to improve the S/N ratio. Therefore, it is desirable to change the detection range (dynamic range) of a sensor circuit at a low cost, for example, by outputting two outputs with different sensitivities from the sensor circuit without providing an external circuit.

Moreover, when the output load characteristics of a plurality of outputs with different sensitivities are different, it is necessary to provide a circuit (for example, an A/D converter) corresponding to the output load characteristic for every output from the sensor circuit. In this case, there is a problem that the costs increase in order to maintain the detection accuracy. Therefore, it is desirable to make the output load characteristics equal for every output from the sensor circuit.

In the devices disclosed in JP-A-2000-88578, JP-A-2006-292469, JP-A-2002-267452, and JP-A-11-282502, however, the power consumption increases even if the gain is simply changed, because the signal is amplified using a resistance element instead of a switched capacitor circuit. Moreover, in the device disclosed in JP-A-7-218270, the gain may be adjusted, but only sample and hold of a detection signal is performed. Accordingly, in the devices disclosed in JP-A-2000-88578, JP-A-2006-292469, JP-A-2002-267452, JP-A-11-282502, and JP-A-7-218270, noise is amplified as is. As a result, it is not possible to obtain a high-sensitivity output because noise is also amplified, even though the high-sensitivity output is needed. Moreover, in the devices disclosed in JP-A-2000-88578, JP-A-2006-292469, JP-A-2002-267452, JP-A-11-282502, and JP-A-7-218270, an offset voltage difference between operational amplifiers which amplify each output occurs. For example, both outputs are different even in a stopped state. As a result, there is a problem in that signal processing at the subsequent stage becomes complicated and the usability becomes worse accordingly. In addition, in the devices disclosed in JP-A-2000-88578, JP-A-2006-292469, JP-A-2002-267452, JP-A-11-282502, and JP-A-7-218270, it is not possible to make the output load capacity equal for every output when outputting a plurality of kinds of outputs.

SUMMARY

An advantage of some aspects of the invention is that it provides a detector which sets the output load capacity equal and which can improve the S/N ratio at a low cost, a physical quantity measuring device, and an electronic apparatus when performing an output operation with a plurality of kinds of sensitivities.

(1) According to an aspect of the invention, there is provided a detector that detects a detection signal corresponding to driving vibration, which excites a vibrator in an oscillation loop, and a physical quantity to be measured including: an amplifying circuit that amplifies a signal corresponding to the driving vibration and the physical quantity; a synchronous detection circuit that detects the amplified signal of the amplifying circuit in synchronization with an oscillation signal in the oscillation loop; an impedance conversion circuit that converts the output impedance of the synchronous detection circuit; a first low pass filter (LPF) to which the output signal of the impedance conversion circuit is supplied and which outputs a first detection signal; and a second low pass filter to which the output signal of the impedance conversion circuit is supplied and which outputs a second detection signal. Each of the first and second low pass filters is formed by a switched capacitor filter circuit. The gain of the first low pass filter is different from that of the second low pass filter. The output load capacity of the first low pass filter and the output load capacity of the second low pass filter are set to be equal.

According to the aspect of the invention, the characteristics can be precisely determined by the relative values of the capacitances of capacitors. Therefore, it is possible to provide a detector suitable for integration in which the detection range and the detection sensitivity are set to be different when performing an output operation with a plurality of kinds of sensitivities and which is inexpensive, has a small offset voltage difference, and has an improved S/N ratio. Moreover, according to the aspect of the invention, the characteristics of a subsequent-stage circuit (for example, an A/D conversion circuit) of the first low pass filter and a subsequent-stage circuit of the second low pass filter can be made equal. As a result, a detector with high detection accuracy can be provided at a low cost without preparing a circuit corresponding to the output load characteristics of each LPF.

(2) In another aspect of the invention, the detector may be configured such that each of the first and second low pass filters includes: a first integrator formed by a switched capacitor circuit having a first operational amplifier; a second integrator which is formed by a switched capacitor circuit having a second operational amplifier and which is connected to the output end of the first integrator; a feedback capacitor circuit having a third feedback capacitor inserted between the output end of the second integrator and the virtual ground end of the first operational amplifier; and a fourth feedback capacitor connected in parallel to the feedback capacitor circuit. The first integrator may include: a first input capacitor circuit connected between the output end of the impedance conversion circuit and the virtual ground end of the first operational amplifier; and a first feedback capacitor connected between the output end of the first operational amplifier and the virtual ground end of the first operational amplifier. The first integrator may input a voltage difference between the output end of the impedance conversion circuit and the virtual ground end of the first operational amplifier and some charges, which are stored by a plurality of capacitors of the first integrator, to the virtual ground end of the first operational amplifier through a switch, and may change the output potential of the first operational amplifier using the first feedback capacitor. The second integrator may include: a second input capacitor circuit connected between the output end of the first operational amplifier and the virtual ground end of the second operational amplifier; and a second feedback capacitor connected between the output end of the second operational amplifier and the virtual ground end of the second operational amplifier. The second integrator may input a voltage difference between the output end of the first operational amplifier and the virtual ground end of the second operational amplifier and some charges, which are stored by a plurality of capacitors of the second integrator, to the virtual ground end of the second operational amplifier through a switch, and may change the output potential of the second operational amplifier using the second feedback capacitor.

In the detector described above, each of the first and second low pass filters with different gains is formed as a second-order low pass filter using the first and second integrators each of which is formed by a switched capacitor circuit having an operational amplifier, the feedback capacitor circuit, and the fourth feedback capacitor. Accordingly, a detector which outputs first and second detection signals with a highly precise filter effect can be provided only with the relative values of the capacitance values of capacitors.

(3) In still another aspect of the invention, the detector may be configured such that each of the first and second low pass filters includes: a first input capacitor circuit which has a first input capacitor and a second input capacitor, which is set to have the same capacitance value as the first input capacitor, and to which the output signal of the impedance conversion circuit is supplied; a first operational amplifier which amplifies a signal corresponding to the amount of electric charge charged in the first input capacitor circuit; a first integrator having a first feedback capacitor inserted between the virtual ground end and the output end of the first operational amplifier; a second input capacitor circuit which has a third input capacitor and a fourth input capacitor, which is set to have the same capacitance value as the third input capacitor, and which is connected to the output end of the first operational amplifier; a second operational amplifier which amplifies a signal corresponding to the amount of electric charge charged in the second input capacitor circuit; a second integrator having a second feedback capacitor inserted between the virtual ground end and the output end of the second operational amplifier; a feedback capacitor circuit having a third feedback capacitor which is formed so as to be able to be inserted between the output end of the second integrator and the virtual ground end of the first operational amplifier; and a fourth feedback capacitor connected in parallel to the feedback capacitor circuit. The first input capacitor circuit may transfer electric charge, which is charged in the second input capacitor in synchronization with a second clock with a phase opposite to a phase of a first clock, to the first input capacitor in synchronization with the first clock and may transfer electric charge, which is charged in the first input capacitor, to the first feedback capacitor in synchronization with the second clock. The second input capacitor circuit may transfer electric charge, which is charged in the fourth input capacitor in synchronization with the first clock, to the third input capacitor in synchronization with the second clock and may transfer electric charge, which is charged in the third input capacitor, to the second feedback capacitor in synchronization with the first clock. The feedback capacitor circuit may be inserted between the output end of the second integrator and the virtual ground end of the first operational amplifier in synchronization with the first clock, and may discharge an electric charge, which is charged in the third feedback capacitor, in synchronization with the second clock.

In the detector described above, in addition to the above effects, each of the first and second low pass filters with different gains is formed as a second-order low pass filter using a switched capacitor filter circuit which uses the first to fourth input capacitors and the first to fourth feedback capacitors. Accordingly, a detector which outputs first and second detection signals with a highly precise filter effect can be provided only with the relative values of the capacitance values of capacitors.

(4) In yet another aspect of the invention, the detector may be configured such that the first input capacitor circuit includes: a first switch inserted between a signal input node, to which the output signal of the impedance conversion circuit is supplied, and one end of the first input capacitor; a second switch inserted between the one end of the first input capacitor and a reference potential; a third switch inserted between the signal input node and one end of the second input capacitor; a fourth switch inserted between the one end of the second input capacitor and the reference potential; a fifth switch inserted between the other end of the second input capacitor and the reference potential; a sixth switch inserted between the other end of the second input capacitor and the other end of the first input capacitor; and a seventh switch inserted between the other end of the first input capacitor and the virtual ground end of the first operational amplifier. The second input capacitor circuit may include: an eighth switch inserted between a connection node, to which the output of the first operational amplifier is supplied, and one end of the third input capacitor; a ninth switch inserted between the one end of the third input capacitor and the reference potential; a tenth switch inserted between the connection node and one end of the fourth input capacitor; an eleventh switch inserted between the one end of the fourth input capacitor and the reference potential; a twelfth switch inserted between the other end of the fourth input capacitor and the reference potential; a thirteenth switch inserted between the other end of the fourth input capacitor and the other end of the third input capacitor; and a fourteenth switch inserted between the other end of the third input capacitor and the virtual ground end of the second operational amplifier. The feedback capacitor circuit may include: a fifteenth switch inserted between the virtual ground end of the first operational amplifier and one end of the third feedback capacitor; a sixteenth switch inserted between the one end of the third feedback capacitor and the reference potential; a seventeenth switch inserted between the other end of the third feedback capacitor and the reference potential; and an eighteenth switch inserted between the other end of the third feedback capacitor and the output end of the second operational amplifier.

In the detector described above, in addition to the above effects, a detector capable of realizing a switched capacitor operation using a plurality of capacitors with a simple configuration can be provided only by providing the plurality of switches.

(5) In still yet another aspect of the invention, the detector may be configured such that each of the first, fourth, sixth, ninth, tenth, twelfth, fourteenth, fifteenth, and eighteenth switches is switching-controlled by the first clock, and each of the second, third, fifth, seventh, eighth, eleventh, thirteenth, sixteenth, and seventeenth switches is switching-controlled by the second clock.

In the detector described above, each of the switches which form a switched capacitor circuit is made to operate by either one of the first and second clocks with opposite phases. Accordingly, it is possible to provide a detector capable of obtaining the above effects by simple clock control.

(6) In further another aspect of the invention, the detector may be configured such that the shapes and areas of the second, third, and fourth feedback capacitors in each of the first and second low pass filters are set to be equal. The second, third, and fourth feedback capacitors in each of the first and second low pass filters are manufactured through a common manufacturing process.

In the detector described above, in addition to the above effects, the output load capacity of the first low pass filter and the output load capacity of the second low pass filter can be made equal only by making the shapes and areas of capacitors, which form each of the first and second low pass filters, equal without providing an additional circuit.

(7) In still further another aspect of the invention, the detector may be configured such that the shapes and areas of the third and fourth input capacitors and the third feedback capacitor are set to be equal. The third and fourth input capacitors and the third feedback capacitor may be manufactured through a common manufacturing process.

In the detector described above, in addition to the above effects, the capacitance value of the third feedback capacitor can be set to the minimum capacitance value when the characteristics of the first and second low pass filters set to have different gains are made to be equal. Accordingly, the areas of the first and second low pass filters can be minimized.

(8) In yet further another aspect of the invention, the detector may be configured such that the ratio of the capacitance value of the first input capacitor and the capacitance value of the third feedback capacitor in the first low pass filter are set to be different from the ratio of the capacitance value of the first input capacitor and the capacitance value of the third feedback capacitor in the second low pass filter.

In the detector described above, since the ratio of the capacitance value of the first input capacitor and the capacitance value of the third feedback capacitor in the first low pass filter is set to be different from the ratio of the capacitance value of the first input capacitor and the capacitance value of the third feedback capacitor in the second low pass filter, it is possible to provide the first and second low pass filters in which the capacitance values of other capacitors are equal and which are set to have different gains.

(9) In still yet further another aspect of the invention, the detector may be configured such that the capacitance value of the third feedback capacitor in the first low pass filter are set to be equal to the capacitance value of the third feedback capacitor in the second low pass filter. The capacitance value of the first input capacitor in the first low pass filter may be different from the capacitance value of the first input capacitor in the second low pass filter.

In the detector described above, in addition to the above effects, a detector having the first and second low pass filters in which other capacitance values are equal and which have different gains can be provided only by making the capacitance value of the first input capacitor (and second input capacitor) different.

(10) In a further aspect of the invention, the detector may be configured such that, in the first and second low pass filters, the shapes and areas of elements which form each low pass filter are set to be equal except for the capacitance values of the first and second input capacitors in each low pass filter.

In the detector described above, in addition to the above effects, a very weak detection signal can also be detected since there is almost no offset voltage difference between the first and second operational amplifiers and processing at the subsequent stage is simplified. As a result, it is possible to provide a detector capable of outputting detection signals with a plurality of kinds of sensitivities and with an excellent S/N ratio.

(11) In a still further aspect of the invention, the detector may be configured such that, assuming that a frequency of each of the first and second clocks is T, a Q factor of the first low pass filter is Q, a capacitance value of the third feedback capacitor is 1, and ω is a cut-off frequency on the s plane, the capacitance value D of the first feedback capacitor and the capacitance value B of the second feedback capacitor have relationship expressed as follows.

$$B \cdot D = \frac{\frac{4}{T^2} + \frac{2\omega_0}{TQ} + \omega_0^2}{4\omega_0^2} \quad \left( \text{where, } \omega_0 = \frac{2}{T}\tan\frac{\omega T}{2} \right)$$

In the detector described above, in addition to the above effects, the capacitance value of the third feedback capacitor can be set to the minimum capacitance value when the characteristics of the first and second low pass filters set to have different gains are made to be equal. Accordingly, the areas of the first and second low pass filters can be minimized.

(12) In a yet further aspect of the invention, the detector may be configured such that each of the first and second clocks in the first low pass filter have the same phase and frequency as each of the first and second clocks in the second low pass filter.

In the detector described above, in addition to the above effects, it is possible to provide a detector having second-order first and second low pass filters in which the leakage of a clock signal is minimal.

(13) In a still yet further aspect of the invention, the detector may be configured such that the physical quantity is angular velocity.

In the detector described above, it is possible to provide an angular velocity sensor capable of performing an output operation with a plurality of kinds of sensitivities which is inexpensive, has a small offset voltage difference, and has an improved S/N ratio.

(14) According to a furthermore aspect of the invention, there is provided a physical quantity measuring device including: a driving circuit which forms an oscillation loop together with a vibrator and excites the vibrator to perform a driving vibration; and the detector described above. The driving circuit outputs a reference signal, which is obtained by binarizing the oscillation signal, to the detector. The synchronous detection circuit detects the amplified signal in synchronization with the reference signal.

According to the aspect of the invention, it is possible to provide a physical quantity measuring device capable of measuring a physical quantity with a plurality of kinds of sensitivities which is inexpensive, has a small offset voltage difference, and has an improved S/N ratio.

(15) According to a still furthermore aspect of the invention, there is provided an electronic apparatus including the detector described above.

According to the aspect of the invention, it is possible to provide an electronic apparatus to which the detector capable of performing an output operation with a plurality of kinds of sensitivities, which is inexpensive and has a small offset voltage difference and an improved S/N ratio, is applied.

(16) According to a yet furthermore aspect of the invention, there is provided an electronic apparatus including the physical quantity measuring device described above.

According to the aspect of the invention, it is possible to provide an electronic apparatus to which the physical quantity measuring device capable of measuring the physical quantity with a plurality of kinds of sensitivities, which is inexpensive and has a small offset voltage difference and an improved S/N ratio, is applied.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the accompanying drawings. In addition, the embodiments described below are not intended to limit the contents of the invention defined by the appended claims. In addition, all of the configurations described below are not necessarily essential components which are required to achieve the advantages of the invention.

1. Sensor Circuit

Figure 1:
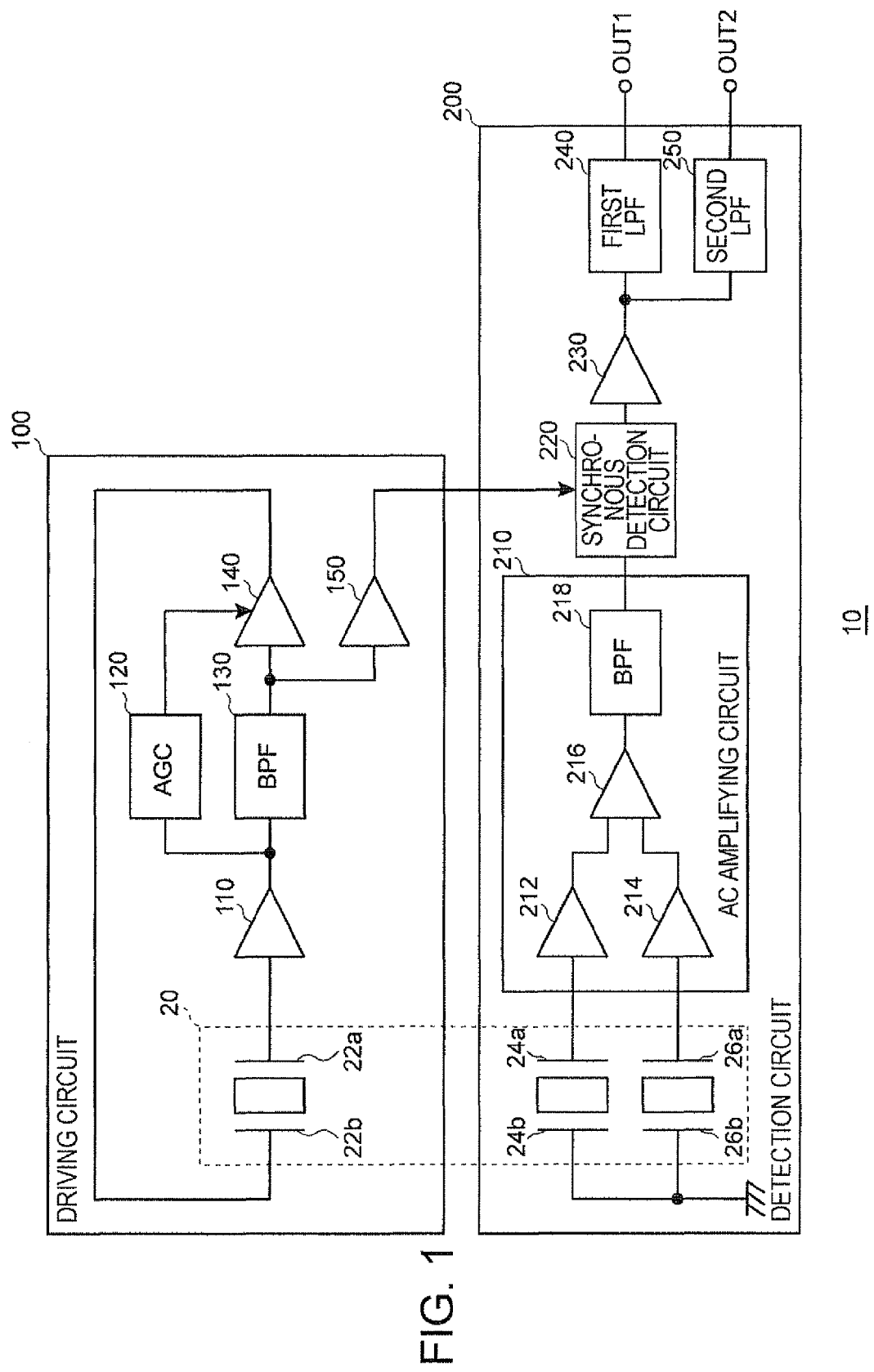
FIG. 1 is a diagram showing an example of the configuration of a sensor circuit in an embodiment of the invention.

FIG. 1 is shows an example of the configuration of a sensor circuit in an embodiment of the invention. Moreover, this circuit configuration is an example and, for example, the detailed configuration of the circuit may be changed.

A sensor circuit 10 is a physical quantity measuring device which measures angular velocity as a physical quantity to be measured. The sensor circuit 10 includes a driving circuit (driving device) 100 and a detection circuit (detector) 200. The sensor circuit 10 is formed of a piezoelectric material, and includes a vibrating reed (vibrator) 20 which has a driving vibrating reed and a detecting vibrating reed. In the driving circuit 100, the driving vibrating reed is provided in the oscillation loop through driving electrodes 22a and 22b provided in the driving vibrating reed, such that the driving vibrating reed (in a broad sense, a vibrator) is excited. The driving circuit 100 includes a current to voltage converter 110, an auto gain control (hereinafter, abbreviated to AGC) circuit 120, a band pass filter (hereinafter, abbreviated to BPF) 130, a gain control amplifier (hereinafter, abbreviated to GCA) 140, and a binarization circuit 150. The driving electrode 22a of the driving vibrating reed is electrically connected to the input end of the current to voltage converter 110, and the output of the current to voltage converter 110 is input to the AGC circuit 120 and the BPF 130. The BPF 130 functions as a phase adjusting circuit of an oscillation signal in the oscillation loop, and the output of the BPF 130 is input to the GCA 140 and the binarization circuit 150. The AGC circuit 120 controls the gain of the GCA 140 on the basis of the output of the current to voltage converter 110. The output of the GCA 140 is electrically connected to the driving electrode 22b of the driving vibrating reed. The binarization circuit 150 binarizes the oscillation signal in the oscillation loop and outputs it to the detection circuit 200 as a reference signal. Moreover, although the driving vibrating reed of the vibrating reed 20 is provided in the driving circuit 100 in the expression based on FIG. 1, the driving vibrating reed of the vibrating reed 20 may also be provided outside the driving circuit 100.

In such a driving circuit 100, oscillation starts in a state where the gain in the oscillation loop of the above-described configuration is larger than "1". At this point of time, only noise is input to the driving vibrating reed, but this noise includes waves in a broad frequency range including the intrinsic resonance frequency of driving vibration targeted. A signal including many waves with a targeted intrinsic resonance frequency is output by frequency filter operation of the driving vibrating reed of the vibrating reed 20, this signal is converted into a voltage value in the current to voltage converter 110, and the AGC circuit 120 controls the oscillation amplitude in the oscillation loop by controlling the gain of the GCA 140 on the basis of the voltage value. By repeating such an operation within the oscillation loop, the rate of a signal with the targeted intrinsic resonance frequency increases. Moreover, by the gain control of the GCA 140, the gain (loop gain) while a signal rounds the oscillation loop once gradually approximates to "1". In this state, the driving vibrating reed oscillates stably.

When the driving vibrating reed is excited to oscillate stably and the vibrating reed 20 rotates in a predetermined direction accordingly, the Coriolis force acts on the vibrating reed 20 to make the detecting vibrating reed curved and vibrate. A detection electrode is provided in the detecting vibrating reed. The detection circuit 200 alternately amplifies detection signals with different polarities from two detection electrodes and then synchronously detects them using a reference signal from the driving circuit 100. As a result, a detection signal OUT1 (first detection signal) and a detection signal OUT2 (second detection signal) are output from two low pass filters (hereinafter, abbreviates to LPFs) with different sensitivities.

2. Detection Circuit

The detection circuit 200 includes an AC amplifying circuit 210, a synchronous detection circuit 220, a DC amplifier 230, a first LPF 240, and a second LPF 250. The AC amplifying circuit 210 includes a first current to voltage converter 212, a second current to voltage converter 214, an AC amplifier 216, and a BPF 218. A signal generated at a detection electrode 24a provided in the detecting vibrating reed of the vibrating reed 20 is supplied to the input end of the first current to voltage converter 212, and a signal (signal with a polarity opposite to the polarity of the signal generated at the detection electrode 24a) generated at a detection electrode 26a provided in the detecting vibrating reed of the vibrating reed 20 is supplied to the input end of the second current to voltage converter 214. In addition, a ground power supply voltage is supplied to the detection electrodes 24b and 26b provided in the detecting vibrating reed of the vibrating reed 20. The first and second current to voltage converters 212 and 214 convert the signals generated at the detection electrodes 24a and 26a, respectively, into voltage values, and AC amplification using the two converted voltage values is performed by the AC amplifier 216. The BPF 218 allows a signal only in a predetermined band, which includes the oscillation frequency of the oscillation signal of the driving circuit 100, of the frequency band of the signal amplified by the AC amplifier 216 to pass therethrough. The synchronous detection circuit 220 extracts a detection signal, which is phase-shifted by 90° from the oscillation signal, in synchronization with the reference signal binarized by the binarization circuit 150. The DC amplifier 230 functions as an impedance conversion circuit, and converts the output impedance to low impedance and also amplifies the detection signal. Then, the first and second LPFs 240 and 250 extract only signals in a predetermined low frequency band not from the synchronous detection circuit 220, the output impedance of which changes according to timing, but from the output signal of the DC amplifier 230 and then amplify the signals, and output the amplified signals as the detection signals OUT1 and OUT2, respectively.

The first LPF 240 has a filter function of eliminating a high frequency component of the detection signal amplified by the DC amplifier 230, and outputs a signal after filtering as the detection signal OUT1. Similar to the first LPF 240, the second LPF 250 has a filter function of eliminating a high frequency component of the detection signal amplified by the DC amplifier 230, and outputs a signal after filtering as the detection signal OUT2.

Each of the first and second LPFs 240 and 250 is formed by a switched capacitor filter (hereinafter, abbreviated to SCF) circuit, and the gain of the first LPF 240 is set to be different from the gain of the second LPF 250. More specifically, in the present embodiment, the gain of the first LPF 240 is set to be smaller than the gain of the second LPF 250. In the case of a sensor circuit which detects the angular velocity, the range of detectable angular velocity can be changed by changing the output voltage width per angle of rotation of 1°. Therefore, the detection range can be changed by changing the gain of each LPF within the same power supply voltage. In this case, the detection range (dynamic range) based on the detection signal OUT1 from the first LPF 240 is larger than the detection range based on the detection signal OUT2 from the second LPF 250. On the other hand, the detection sensitivity based on the detection signal OUT1 from the first LPF 240 is lower than the detection sensitivity based on the detection signal OUT2 from the second LPF 250.

In addition, the configuration of the first LPF 240 is the same as that of the second LPF 250, and only the gain of the first LPF 240 is set to be different from that of the second LPF 250. In addition, since the output load capacity of the first LPF 240 is equal to that of the second LPF 250, the output load characteristics are equal for every output with a different sensitivity.

Here, the case is considered in which an LPF, which has the same function as the first and second LPFs 240 and 250, is realized by an RC integrating circuit using a time constant of input resistance R and capacitance C. A cut-off frequency fc of the RC integrating circuit is expressed as $fc=(1/(2\pi \cdot Ci \cdot R))$. Ci is a feedback capacitor (integral capacity) provided in the feedback loop of an operational amplifier. If the case is assumed in which the cut-off frequency is a very low frequency (for example, about 1 Hz), the capacitance value of the feedback capacitor Ci increases, and the area occupied by the circuit significantly increases accordingly. Accordingly, since it is necessary to increase the resistance value of the input resistance R, the width of characteristic variation increases according to manufacturing variations of constituent elements.

On the other hand, in the SCF circuit in which the input resistance R is formed by a switched capacitor (hereinafter, abbreviated to SC) circuit, the resistance value of the input resistance R is expressed as R $1/(fs \cdot Cs)$ (fs: sampling clock frequency, Cs: capacitance of a switched capacitor). Here, if the sampling clock frequency fs is set low, the equivalent resistance of the input resistance R formed by the SC circuit can be increased. Therefore, by forming the first and second LPFs 240 and LPF 250 using the SCF circuit, the characteristics can be precisely determined by the relative values of the capacitances of capacitors. As a result, the detection circuit 200 (or the sensor circuit 10) suitable for integration can be provided.

2.1 First LPF, Second LPF

In the present embodiment, the configuration of the first LPF 240 is the same as that of the second LPF 250. Accordingly, the configuration of the first LPF 240 will be described below.

Figure 2:
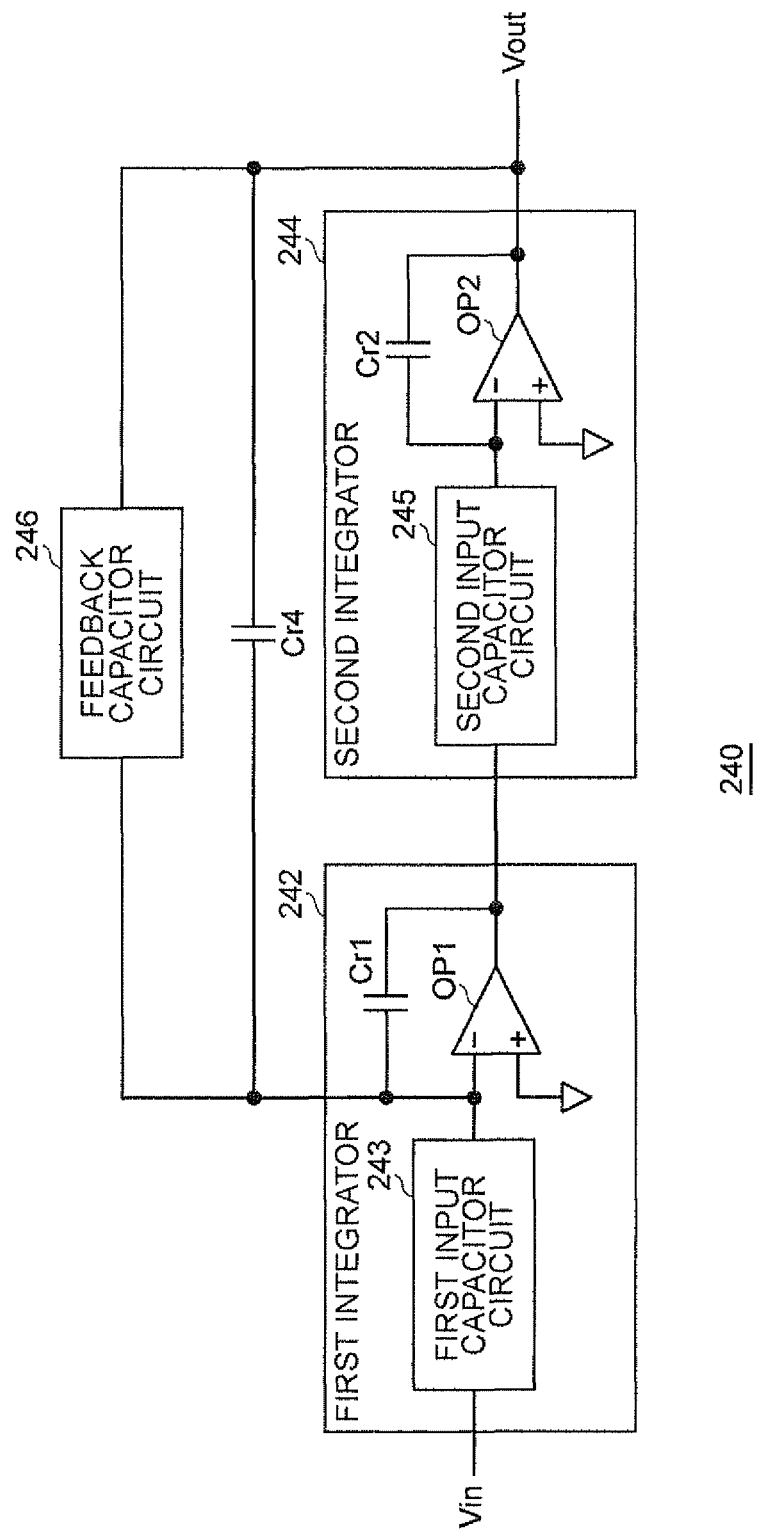
FIG. 2 is a block diagram showing an example of the configuration of a first LPF in the present embodiment.

FIG. 2 is a block diagram showing an example of the configuration of the first LPF 240 in the present embodiment.

The first LPF 240 is a second-order LPF configured to include a first integrator 242, a second integrator 244, a feedback capacitor circuit 246, and a fourth feedback capacitor Cr4.

The first integrator 242 is formed by an SC circuit which has a first operational amplifier OP1. That is, the first integrator 242 includes a switch, a capacitor, and the first operational amplifier OP1. The first integrator 242 includes a first input capacitor circuit 243, which is connected between the output end of the DC amplifier 230 as an impedance conversion circuit and the virtual ground end of the first operational amplifier OP1, and a first feedback capacitor Cr1, which is connected between the output end of the first operational amplifier OP1 and the virtual ground end of the first operational amplifier OP1. Moreover, the first integrator 242 inputs a voltage difference between the output end of the DC amplifier 230 and the virtual ground end of the first operational amplifier OP1 and some electric charge, which are stored by a plurality of capacitors of the first integrator 242, to the virtual ground end of the first operational amplifier OP1 through a switch, and changes the output potential of the first operational amplifier OP1 by the first feedback capacitor Cr1.

The second integrator 244 is formed by an SC circuit, which has a second operational amplifier OP2, and is connected to the output end of the first integrator 242. That is, the second integrator 244 includes a switch, a capacitor, and the second operational amplifier OP2. The second integrator 244 includes a second input capacitor circuit 245, which is connected between the output end of the first operational amplifier OP1 and the virtual ground end of the second operational amplifier OP2, and a second feedback capacitor Cr2, which is connected between the output end of the second operational amplifier OP2 and the virtual ground end of the second operational amplifier OP2. Moreover, the second integrator 244 inputs a voltage difference between the output of the first operational amplifier OP1 and the virtual ground end of the second operational amplifier OP2 and some electric charge, which are stored by a plurality of capacitors of the second integrator 244, to the virtual ground end of the second operational amplifier OP2 through a switch, and changes the output potential of the second operational amplifier OP2 by the second feedback capacitor Cr2.

The feedback capacitor circuit 246 has a third feedback capacitor Cr3 inserted between the output end of the second integrator 244 and the virtual ground end of the first operational amplifier OP1. A fourth feedback capacitor Cr4 is connected in parallel to the feedback capacitor circuit 246.

Thus, the first LPF 240 is formed as an SCF circuit including the first and second integrators 242 and 244, which are SC integrators, the feedback capacitor circuit 246, and the fourth feedback capacitor Cr4. Accordingly, the characteristics can be precisely determined by the relative values of the capacitances of capacitors. In addition, the function of the second-order LPF can be realized by repeatedly performing charging and transfer of the electric charge of capacitors, which form the SCF circuit, by switching control of a switch which forms the SCF circuit.

Therefore, it is preferable that the first LPF 240 shown in FIG. 2 is formed as follows.

That is, the first integrator 242 is an LPF that includes the first input capacitor circuit 243 having a first input capacitor C1 and a second input capacitor C2 set to have the same capacitance value, the first operational amplifier OP1 which amplifies a signal corresponding to the amount of electric charge charged in the first input capacitor circuit 243, and the first feedback capacitor Cr1 inserted between the virtual ground end (input node, inverting input terminal) and the output end of the first operational amplifier OP1. The output signal (impedance-converted signal from the impedance conversion circuit) of the DC amplifier 230 as an impedance conversion circuit shown in FIG. 1 is supplied to the first input capacitor circuit 243. A first clock CLK1 and a second clock CLK2 are input to the first input capacitor circuit 243 (first integrator 242). Electric charge, which is charged in the second input capacitor C2 in a second period T2 for which the second clock CLK2 is at the H level (that is, in synchronization with the second clock CLK2), is transmitted to the first input capacitor C1 in a first period T1 for which the first clock CLK1 is at the H level (that is, in synchronization with the first clock CLK1). In the second period T2, electric charge charged in the first input capacitor C1 is transmitted to the first feedback capacitor Cr1. By repeating this operation, it operates as an LPF.

On the other hand, the second integrator 244 is an LPF that includes the second input capacitor circuit 245 having a third input capacitor C3 and a fourth input capacitor C4 set to have the same capacitance value, the second operational amplifier OP2 which amplifies a signal corresponding to the amount of electric charge charged in the second input capacitor circuit 245, and the second feedback capacitor Cr2 inserted between the virtual ground end and the output end of the second operational amplifier OP2. The output signal of the DC amplifier 230 as an impedance conversion circuit shown in FIG. 1 is supplied to the second input capacitor circuit 245. The first clock CLK1 and the second clock CLK2 are input to the second input capacitor circuit 245 (second integrator 244). Electric charge, which is charged in the fourth input capacitor C4 in the first period T1 (that is, in synchronization with the first clock CLK1), is transmitted to the third input capacitor C3 in the second period T2. In the first period T1, electric charge charged in the third input capacitor C3 is transmitted to the second feedback capacitor Cr2. By repeating this operation, it operates as an LPF.

The feedback capacitor circuit 246 is inserted between the output end of the second integrator 244 and the virtual ground end of the first operational amplifier OP1 in the first period T1 and discharges the electric charge, which is charged in the third feedback capacitor Cr3, in the second period T2.

In addition, the first input capacitor circuit 243 has three or more input capacitors, and may perform charging and discharging or transfer of electric charge as described above in synchronization with the first and second clocks CLK1 and CLK2. The first input capacitor circuit 243 is an SC circuit including the first and second input capacitors C1 and C2. Although the first input capacitor circuit 243 is not limited to having this configuration, it is possible to realize an LPF in which the spread of element values is suppressed, the total capacitance is small, and the element area is very small by adopting such a configuration which will be described below.

Similarly, the second input capacitor circuit 245 has three or more input capacitors, and may perform charging and discharging or transfer of electric charge as described above in synchronization with the first and second clocks CLK1 and CLK2. The second input capacitor circuit 245 is an SC circuit including the third and fourth input capacitors C3 and C4. Although the second input capacitor circuit 245 is not limited to having this configuration, it is possible to realize an LPF in which the spread of element values is suppressed, the total capacitance is small, and the element area is very small by adopting such a configuration which will be described below.

In addition, the feedback capacitor circuit 246 is an SC circuit having the third feedback capacitor Cr3. The feedback capacitor circuit 246 is configured to include a switch on which control corresponding to switch control on the switches included in the first and second input capacitor circuits 243 and 245, which are similarly formed by SC circuits, is performed.

Figure 3:
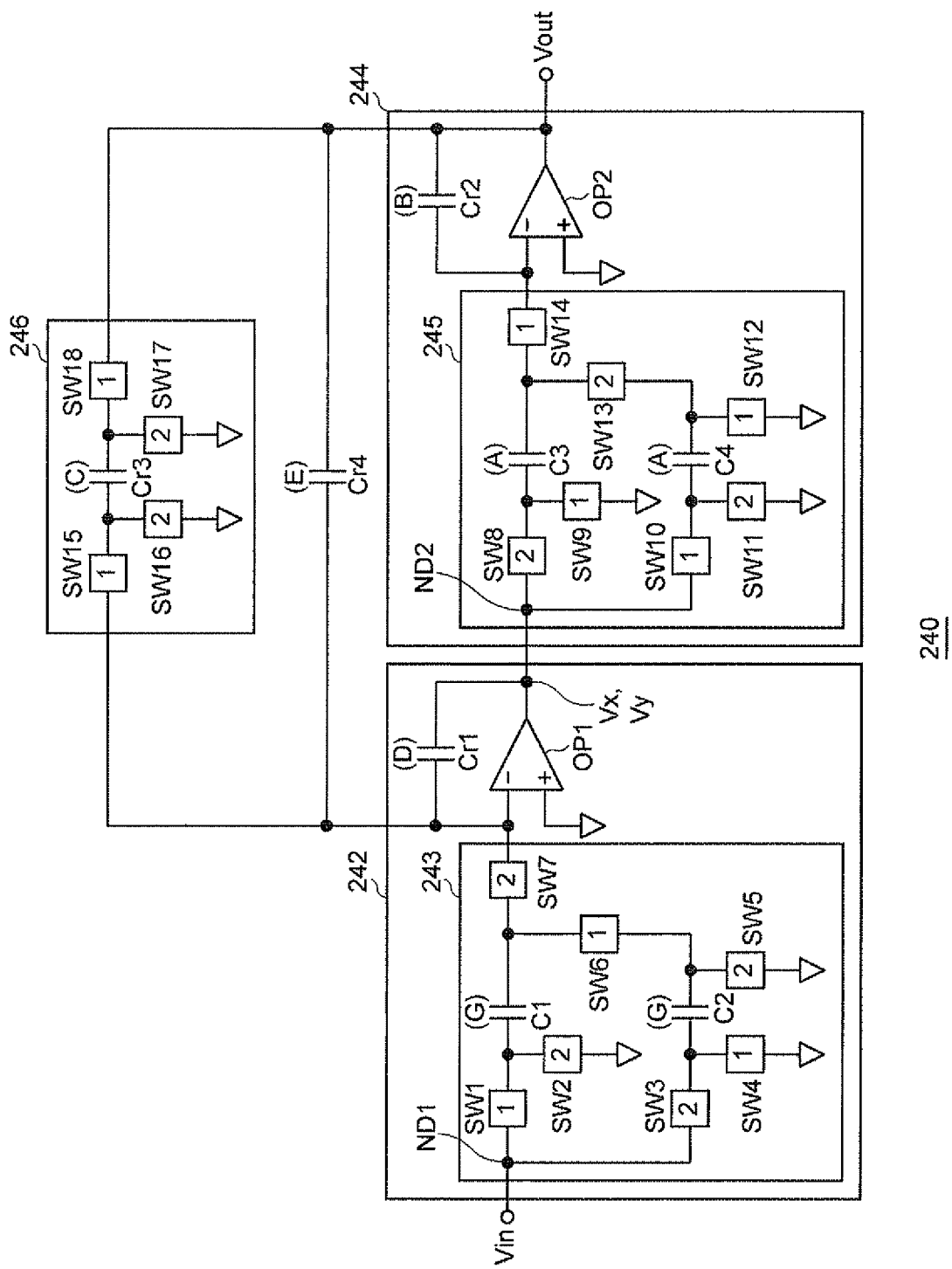
FIG. 3 is a circuit diagram showing an example of the configuration of the first LPF in the present embodiment.

FIG. 3 is a circuit diagram showing an example of the configuration of the first LPF 240 in the present embodiment. Although FIG. 3 shows the configuration of the first LPF 240, the configuration of the second LPF 250 is also the same as that shown in FIG. 3. In FIG. 3, the same sections as in FIG. 2 are denoted by the same reference numerals, and the explanation will be appropriately omitted.

Figure 4:
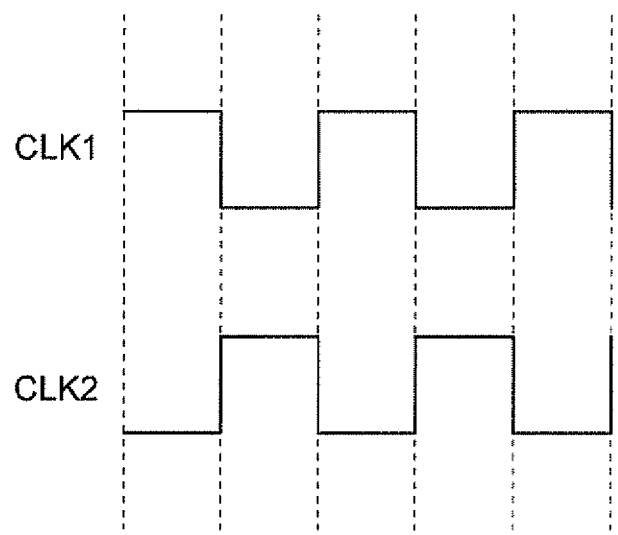
FIG. 4 is an explanatory view of first and second clocks in the present embodiment.

FIG. 4 is an explanatory view of the first and second clocks CLK1 and CLK2 in the present embodiment.

Moreover, in FIG. 3, a plurality of switches is provided in an SC circuit, and there are two kinds of switches. That is, there are a switch denoted as "1" and a switch denoted as "2". The switch denoted as "1" is a switch (first phase switch) which operates by the first clock CLK1. That is, the switch denoted as "1" is in a conduction state in the active period (period of an H level) of the first clock CLK1 and is in a non-conduction state in the non-active period (period of an L level) of the first clock CLK1. The switch denoted as "2" is a switch (second phase switch) which operates by the second clock CLK2. That is, the switch denoted as "2" is in a conduction state in the active period (period of an H level) of the second clock CLK2 and is in a non-conduction state in the non-active period (period of an L level) of the second clock CLK2.

Moreover, in FIG. 3, the capacitance value is given in parentheses for a capacitor which forms the first LPF 240. That is, the capacitance value of the first input capacitor C1 is set to be the same as that of the second input capacitor C2 and has a capacitance value G. The first feedback capacitor Cr1 is set to have a capacitance value D. The capacitance value of the third input capacitor C3 is set to be the same as that of the fourth input capacitor C4 and has a capacitance value A. The second feedback capacitor Cr2 is set to have a capacitance value B. The third feedback capacitor Cr3 is set to have a capacitance value C. The fourth feedback capacitor Cr4 is set to have a capacitance value E.

In the first LPF 240, the first and second clocks CLK1 and CLK2 are input as operation clocks for controlling the switching operation of a switch, which forms the SC circuit, as shown in FIG. 4. The second clock CLK2 is a clock with an opposite phase to the first clock. Each clock changes such that a switch, which is switching-controlled by the first clock CLK1, and a switch, which is switching-controlled by the second clock CLK2, are not turned on simultaneously. In addition, two operation clocks, which have the same phases as the first and second clocks CLK1 and CLK2 of the first LPF 240 and have the same frequency, are supplied to the second LPF 250. In this way, it is possible to provide the second-order first and second LPFs 240 and 250 in which the leakage of a clock signal is minimal.

As shown in FIG. 3, the first input capacitor circuit 243 has: a first switch SW1 inserted between a signal input node ND1, to which the output signal (impedance-converted signal) of the DC amplifier 230 is supplied, and one end of the first input capacitor C1; a second switch SW2 inserted between the one end of the first input capacitor C1 and the reference potential (for example, an analog ground potential AGND); a third switch SW3 inserted between the signal input node ND1 and one end of the second input capacitor C2; a fourth switch SW4 inserted between the one end of the second input capacitor C2 and the reference potential; a fifth switch SW5 inserted between the other end of the second input capacitor C2 and the reference potential; a sixth switch SW6 inserted between the other end of the second input capacitor C2 and the other end of the first input capacitor C1; and a seventh switch SW7 inserted between the other end of the first input capacitor C1 and the virtual ground end of the first operational amplifier OP1.

As shown in FIG. 3, each of the first switch SW1, the fourth switch SW4, and the sixth switch SW6 is switching-controlled by the first clock CLK1, and is set to have a conduction state in the active period of the first clock CLK1 and to have a non-conduction state in the non-active period of the first clock CLK1. Each of the second switch SW2, the third switch SW3, the fifth switch SW5, and the seventh switch SW7 is switching-controlled by the second clock CLK2, and is set to have a conduction state in the active period of the second clock CLK2 and to have non-conduction state in the non-active period of the second clock CLK2.

The second input capacitor circuit 245 has: an eighth switch SW8 inserted between a connection node ND2, to which the output of the first operational amplifier OP1 is supplied, and one end of the third input capacitor C3; a ninth switch SW9 inserted between the one end of the third input capacitor C3 and the reference potential; a tenth switch SW10 inserted between the connection node ND2 and one end of the fourth input capacitor C4; an eleventh switch SW11 inserted between the one end of the fourth input capacitor C4 and the reference potential; a twelfth switch SW12 inserted between the other end of the fourth input capacitor C4 and the reference potential; a thirteenth switch SW13 inserted between the other end of the fourth input capacitor C4 and the other end of the third input capacitor C3; and a fourteenth switch SW14 inserted between the other end of the third input capacitor C3 and the virtual ground end of the second operational amplifier OP2.

As shown in FIG. 3, each of the ninth switch SW9, the tenth switch SW10, the twelfth switch SW12, and the fourteenth switch SW14 is switching-controlled by the first clock CLK1, and is set to have a conduction state in the active period of the first clock CLK1 and to have a non-conduction state in the non-active period of the first clock CLK1. Each of the eighth switch SW8, the eleventh switch SW11, and the thirteenth switch SW13 is switching-controlled by the second clock CLK2, and is set to have a conduction state in the active period of the second clock CLK2 and to have a non-conduction state in the non-active period of the second clock CLK2.

The feedback capacitor circuit 246 has: a fifteenth switch SW15 inserted between the virtual ground end of the first operational amplifier OP1 and one end of the third feedback capacitor Cr3; a sixteenth switch SW16 inserted between the one end of the third feedback capacitor Cr3 and the reference potential; a seventeenth switch SW17 inserted between the other end of the third feedback capacitor Cr3 and the reference potential; and an eighteenth switch SW18 inserted between the other end of the third feedback capacitor Cr3 and the output end of the second operational amplifier OP2.

As shown in FIG. 3, each of the fifth switch SW15 and the eighteenth switch SW18 is switching-controlled by the first clock CLK1, and is set to have a conduction state in the active period of the first clock CLK1 and to have a non-conduction state in the non-active period of the first clock CLK1. Each of the sixteenth switch SW16 and the seventeenth switch SW17 is switching-controlled by the second clock CLK2, and is set to have a conduction state in the active period of the second clock CLK2 and to have a non-conduction state in the non-active period of the second clock CLK2.

In the configuration shown in FIG. 3, an operation is performed in which electric charge is stored in a capacitor or the electric charge stored in the capacitor are discharged at a timing of the first or second clock CLK1 or CLK2 and charge transfer caused by the discharge is integrated using an operational amplifier and a feedback capacitor. An electric charge stored in a capacitor and an electric charge discharged from the capacitor are equal.

Figure 5:
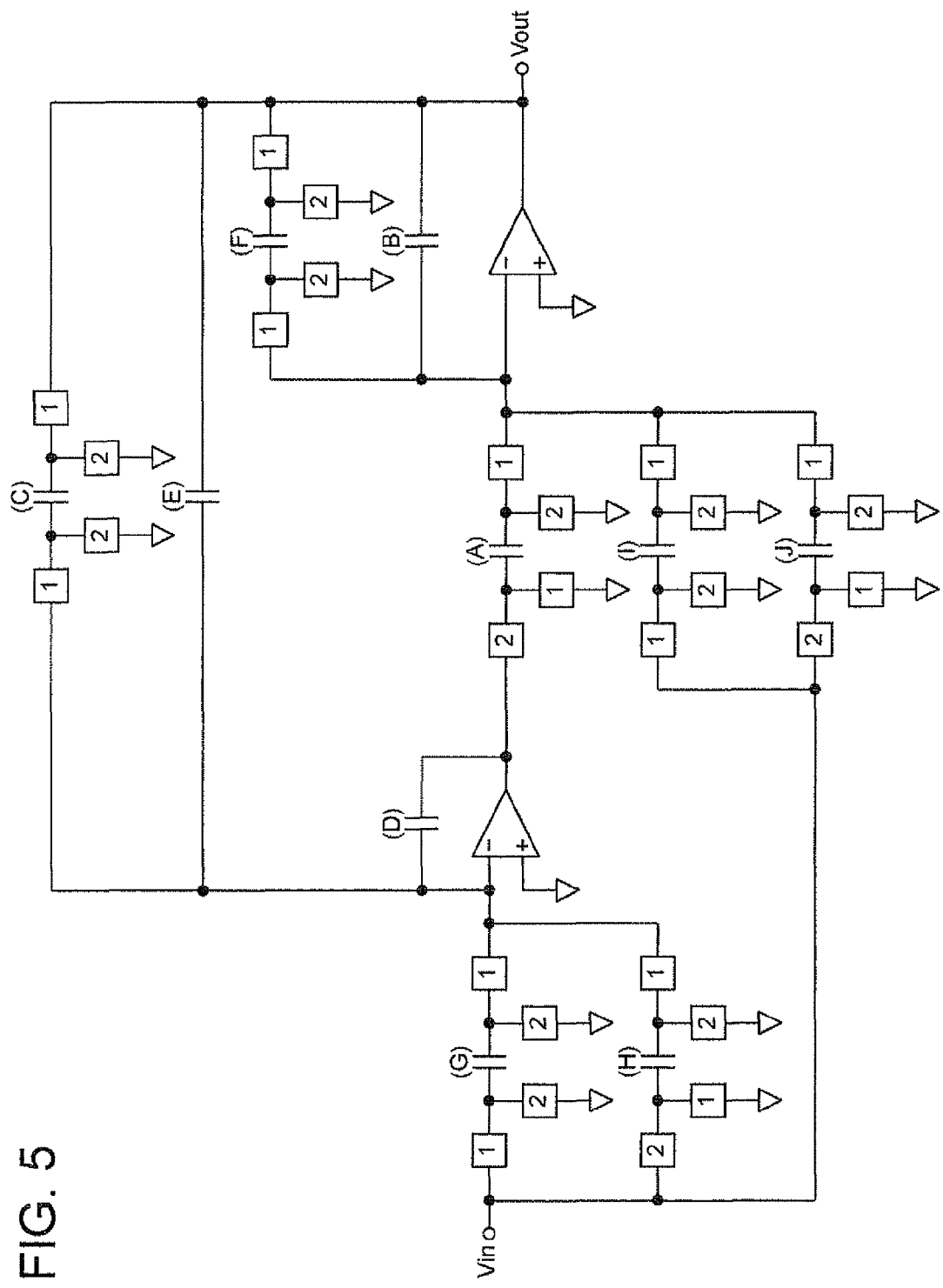
FIG. 5 is a circuit diagram showing an example of the configuration of an LPF of Fleisher & Laker.

FIG. 5 is a circuit diagram showing an example of the configuration of an LPF of Fleisher & Laker which is well known as an LPF using an SC circuit. FIG. 5 shows an example of the configuration of a second-order LPF, and sections corresponding to FIG. 3 are denoted by the same reference numerals.

In the LPF of Fleisher & Laker shown in FIG. 5, an input signal Vin supplied to a signal input node is also supplied to a second integrator. Accordingly, the element values of the capacitor with the capacitance value D, the capacitor with the capacitance value A, and the capacitor with the capacitance value B are influenced by the element value of the capacitor with the capacitance value I or the capacitor with the capacitance value J to which the input signal Vin is supplied.

On the other hand, in the configuration shown in FIG. 3, the input signal Vin supplied to the signal input node is not supplied to the second integrator 244. That is, the first feedback capacitor Cr1, the third input capacitor C3, the fourth input capacitor C4, and the second feedback capacitor Cr2 are not influenced by other input capacitor elements. Accordingly, sizing of the first feedback capacitor Cr1 and the third input capacitor C3 (or the fourth input capacitor C4) and the sizing of the third input capacitor C3 (or the fourth input capacitor C4) and the second feedback capacitor Cr2 become possible. In addition, since the capacitance values of the third input capacitor C3 (or the fourth input capacitor C4) and the third feedback capacitor Cr3 can be set to be equal, the capacitance values of the first and second feedback capacitors Cr1 and Cr2 can be uniquely determined. As a result, since the spread of element values of the elements which form the LPF is suppressed, highly precise design of the first LPF 240 can be easily realized.

2.2 Transfer Function of the First LPF

A transfer function of the first LPF 240 is calculated as follows.

Figure 6:
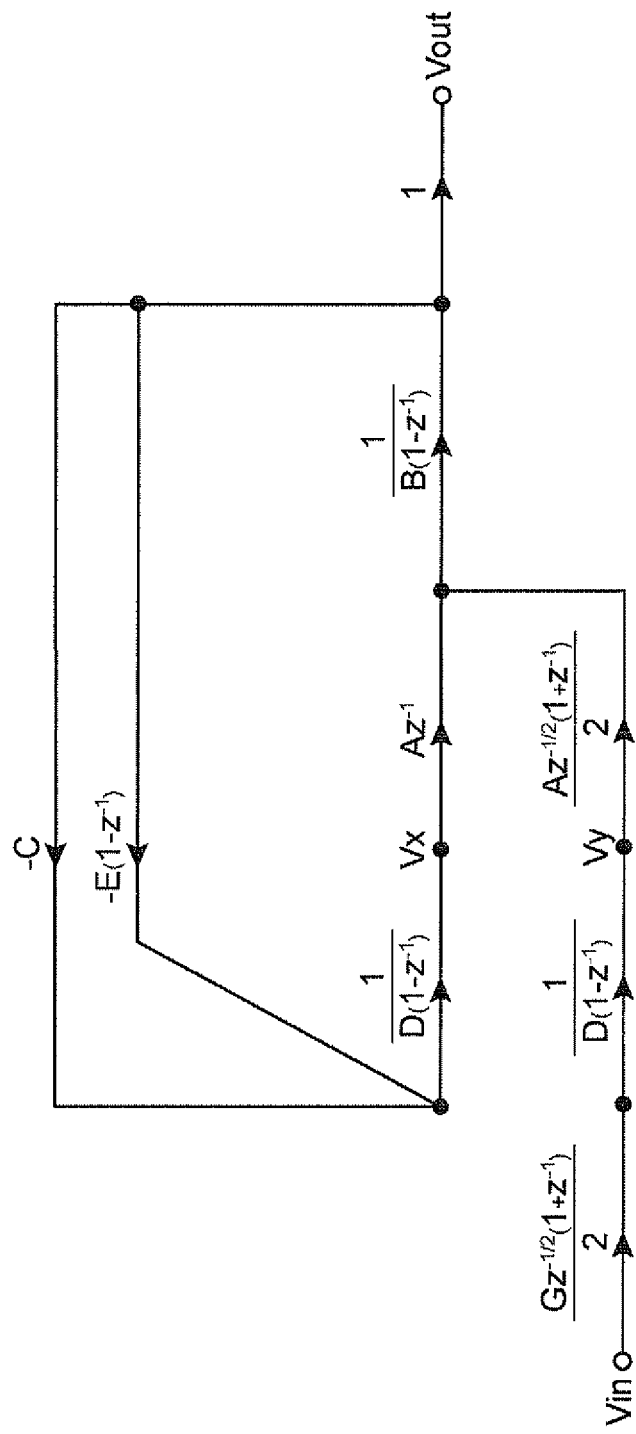
FIG. 6 is a signal flow graph of the first LPF.

FIG. 6 is a signal flow graph of the first LPF 240. In FIG. 6, the voltage of the output node of the first operational amplifier OP1 is expressed as Vx and Vy. Moreover, in FIG. 6, the element value of each element shown in FIG. 3 is expressed as it is.

First, the relationship between the output voltage Vout of the first LPF 240 and the voltage Vx of the output node of the first operational amplifier OP1 is as follows on the z plane.

$$Vx = \frac{\{-C - E \cdot (1 - z^{-1})\} \cdot Vout}{D \cdot (1 - z^{-1})} \quad (1)$$

Similarly, the relationship between the input voltage Vin of the first LPF 240 and the voltage Vy of the output node of the first operational amplifier OP1 is as follows on the z plane.

$$Vy = \frac{\frac{1}{2} \cdot G \cdot z^{-1/2} \cdot (1 + z^{-1}) \cdot Vin}{D \cdot (1 - z^{-1})} \quad (2)$$

If the voltages Vx and Vy are used, the output voltage Vout of the first LPF 240 is expressed as follows on the z plane.

$$Vout = \frac{A \cdot z^{-1/2} \cdot Vx + \frac{1}{2} \cdot A \cdot z^{-1/2} \cdot (1 + z^{-1}) \cdot Vy}{B \cdot (1 - z^{-1})} \quad (3)$$

Substituting expressions (1) and (2) into expression (3), the transfer function T(z)=Vout/Vin of the first LPF 240 changes to the following expression. In addition, since the voltages Vx and Vy are shifted from each other by half clock, $z^{-1/2}$ is considered.

$$T(z) = \frac{Vout}{Vin} = \frac{A \cdot G \cdot z^{-1} \cdot (1 + z^{-1})^2}{4 \cdot \{DB + (AC + AE - 2DB) \cdot z^{-1} + (BD - AE) \cdot z^{-2}\}} \quad (4)$$

As expressed in expression (4), the transfer function T(z) of the first LPF 240 becomes a so-called general second-order LPF function. This means that the first LPF 240 functions as a second-order LPF. While the transfer function of the first LPF 240 has been described until now, it can be seen that the second LPF 250 also functions as a second-order LPF similarly since the configuration of the second LPF 250 is the same as that of the first LPF 240.

2.3 Element Values of the First LPF 2.3.1 Relationship Between the Capacitance Value C and the Capacitance Value G The DC gain DC_Gain of the first LPF 240 is calculated from expression (4).

$$DC\_Gain = \frac{G}{C} \quad (5)$$

That is, the gain of the first LPF 240 is determined by the ratio of the capacitance value of the first input capacitor C1 (second input capacitor C2) (capacitance value G) and the capacitance value of the third feedback capacitor Cr3 (capacitance value C). Since the second LPF 250 has the same configuration as the first LPF 240, the transfer function is also calculated from expression (4). Accordingly, if capacitors which form each of the first and second LPFs 240 and 250 are made to be completely the same in size and shape, the gains of the first and second LPFs 240 and 250 can be easily set by setting G/C in the first LPF 240 to be different from G/C in the second LPF 250.

Here, since the third feedback capacitor Cr3 in the first LPF 240 and the third feedback capacitor Cr3 in the second LPF 250 are made to be completely the same in size and shape, it can be seen that only the first input capacitor C1 (second input capacitor C2) (capacitance value G) in the first LPF 240 and the first input capacitor C1 (second input capacitor C2) (capacitance value G) in the second LPF 250 are preferably set to be different from each other. In the present embodiment, in order to make the gain of the first LPF 240 smaller than the gain of the second LPF 250, the capacitance value of the first input capacitor C1 (second input capacitor C2) in the first LPF 240 is set smaller than the capacitance value of the first input capacitor C1 (second input capacitor C2) in the second LPF 250. In this case, since the configuration of the first LPF 240 and the configuration of the second LPF 250 are almost the same, there is almost no offset voltage difference between operational amplifiers which amplify each output. Accordingly, for example, a situation where both the outputs are different even in a stopped state does not Occur. As a result, signal processing at the subsequent stage becomes simplified.

2.3.2 Regarding the Capacitance Values A to E and G
2.3.2.1 Regarding the Capacitance Values C, E, and G A general state variable type transfer function of a second-order LPF on the s plane is expressed as follows. In the following expression, ω is a cut-off frequency on the s plane, Q is a Q factor, and k is a gain.

$$T(s) = \frac{k \cdot \omega^2}{s^2 + \frac{\omega^2}{Q}s + \omega^2} \quad (6)$$

Here, it is considered to calculate the element values (A to E and G) of the respective elements in FIG. 4 by comparing the coefficient in the transfer function on the z plane, which is obtained by z transform of expression (6), with the coefficient in the transfer function of expression (4) calculated by the signal flow in FIG. 6. First, it is considered to perform bilinear transform on expression (6) using the following expression.

$$s = \frac{2}{T} \cdot \frac{1 - z^{-1}}{1 + z^{-1}} \quad (7)$$

Expression (7) expresses the bilinear transform of mapping the entire region of the left-half plane of the s plane to the unit circle of the z plane and mapping the imaginary axis of the s plane onto the unit circle of the z plane. In expression (7), T is equivalent to the reciprocal of the clock frequency of an LPF. In this case, the correspondence of the actual frequency Ω of s and ω of $z = e^{j\omega T}$ is expressed like expression (8).

$$\Omega = \frac{2}{T} \tan \frac{\omega T}{2} \quad (8)$$

Here, assuming that the cut-off frequency on the z plane is $\omega_0$, expression (8) is expressed like expression (9).

$$\omega_0 = \frac{2}{T} \tan \frac{\omega T}{2} \quad (9)$$

Substituting expressions (7) and (9) into expression (6), T(z) which is a result obtained by z transform of the state variable type transfer function of the second-order LPF is calculated.

$$T(z) = \frac{Vout}{Vin} = \frac{\frac{k\omega_0^2}{\frac{4}{T^2} + \frac{2\omega_0}{TQ} + \omega_0^2}(1+z^{-1})^2}{1 - 2 \cdot \frac{\frac{4}{T^2} - \omega_0^2}{\frac{4}{T^2} + \frac{2\omega_0}{TQ} + \omega_0^2} z^{-1} + \frac{\frac{4}{T^2} - \frac{2\omega_0}{TQ} + \omega_0^2}{\frac{4}{T^2} + \frac{2\omega_0}{TQ} + \omega_0^1}z^{-2}} \quad (10)$$

By comparing the coefficient of a z term of expression (10) with the coefficient of a z term of expression (4), the relationship of A to D and G in expression (4) can be determined. In the present embodiment, the capacitance value D of the first feedback capacitor Cr1, the capacitance value A of the third input capacitor C3, the capacitance value A of the fourth input capacitor C4, and the capacitance value B of the second feedback capacitor Cr2 are not influenced by other input capacitor elements, as previously described using FIG. 5. Accordingly, the relationship of C, E, and G is first calculated by assuming A=B=D=1. In this case, the element value of each element can be freely determined without causing substantial limitations by changing the element value such that the internal voltage is changed without affecting the transfer function as described below.

First, substituting A=B=D=1 into expression (4), the transfer function is expressed as follows.

$$T(z) = \frac{Vout}{Vin} = \frac{G \cdot z^{-1} \cdot (1+z^{-1})^2}{4 \cdot \{1 + (C+E-2) \cdot z^{-1} + (1-E) \cdot z^{-2}\}} \quad (11)$$

If expression (11) is compared with expression (10), C, E, and G in expression (11) are expressed like expressions (12), (13), and (14), respectively.

$$C = \frac{4\omega_0^2}{\frac{4}{T^2} + \frac{2\omega_0}{TQ} + \omega_0^2} \quad (12)$$

$$E = \frac{\frac{4\omega_0}{TQ}}{\frac{4}{T^2} + \frac{2\omega_0}{TQ} + \omega_0^2} \quad (13)$$

$$G = \frac{4k\omega_0^2}{\frac{4}{T^2} + \frac{2\omega_0}{TQ} + \omega_0^2} \quad (14)$$

2.3.2.2 Determination of Element Value

First, the element values are determined such that the output load capacity of the first LPF 240 and the output load capacity of the second LPF 250 are equal. The output load capacity of the first LPF 240 is determined by the capacitance value B of the second feedback capacitor Cr2, the capacitance value C of the third feedback capacitor Cr3, and the capacitance value E of the fourth feedback capacitor Cr4. Therefore, the capacitance value B of the second feedback capacitor Cr2, the capacitance value C of the third feedback capacitor Cr3, and the capacitance value E of the fourth feedback capacitor Cr4 in the first LPF 240 are made to be equal to the capacitance value B of the second feedback capacitor Cr2, the capacitance value C of the third feedback capacitor Cr3, and the capacitance value E of the fourth feedback capacitor Cr4 in the second LPF 250, respectively.

For this reason, it is preferable that the shapes and areas of the second, third, and fourth feedback capacitors Cr2, Cr3, and Cr4 in each of the first and second LPFs 240 and 250 are set to be equal and the second, third, and fourth feedback capacitors Cr2, Cr3, and Cr4 in each of the first and second LPFs 240 and 250 are manufactured through a common manufacturing process.

Accordingly, the characteristics of a subsequent-stage circuit (for example, an A/D conversion circuit) of the first LPF 240 and a subsequent-stage circuit of the second LPF 250 can be made equal. As a result, the detection circuit 10 with high detection accuracy can be provided at a low cost without preparing a circuit corresponding to the output load characteristics of each LPF.

Then, values which are preferable as the element values of the capacitance values A, B, and D without affecting the transfer function of expression (4) will be considered. Here, the value which is preferable as an element value is a value which can suppress the circuit area to a minimum.

Figure 7A:
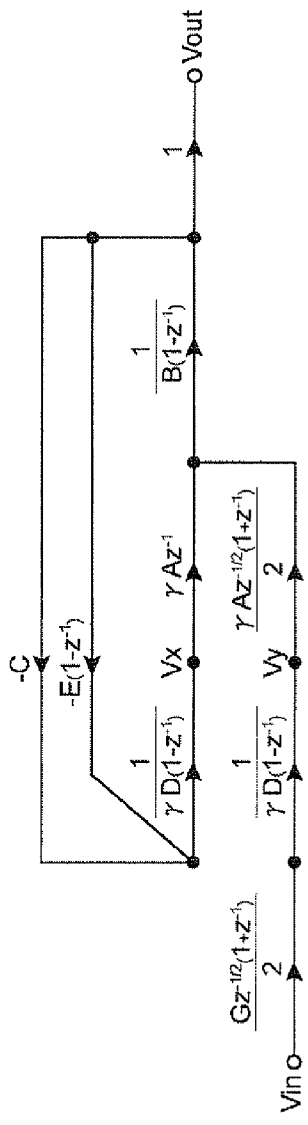
FIGS. 7A to 7C show the signal flows illustrating the relationship among the capacitance value A, the capacitance value B, and the capacitance value D.
Figure 7B:
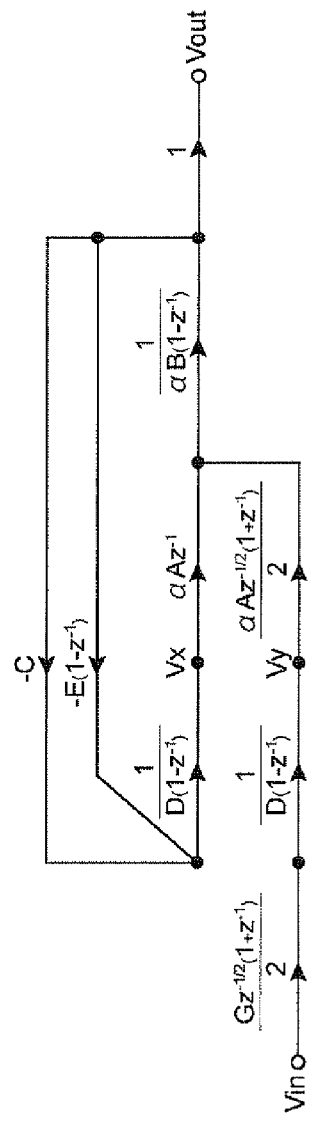
Figure 7C:
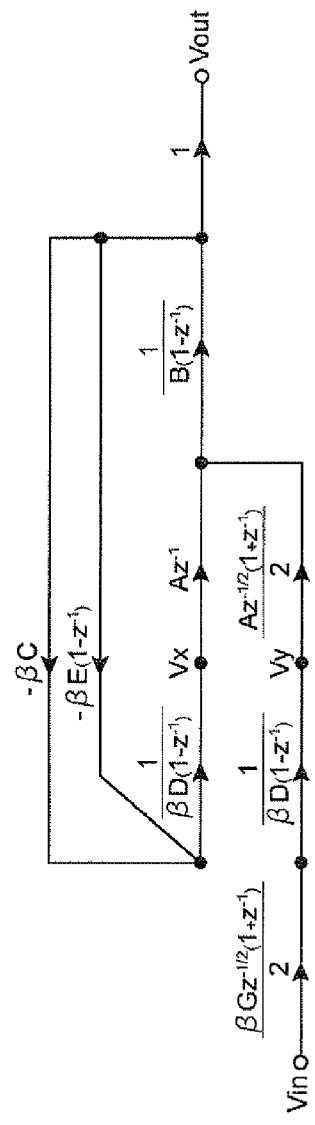

FIGS. 7A to 7C show the signal flows illustrating the relationship among the capacitance value A, the capacitance value B, and the capacitance value D. FIG. 7A shows the relationship between the capacitance value A and the capacitance value D. FIG. 7B shows the relationship between the capacitance value A and the capacitance value B. FIG. 7C shows the relationship between the capacitance value C, the capacitance value D, the capacitance value E, and the capacitance value G. In FIGS. 7A to 7C, the same sections as in FIG. 6 are denoted by the same reference numerals, and the explanation will be appropriately omitted.

In expression (4), if the capacitance value A is multiplied by $\gamma$ (A'=$\gamma$A), the element values of the capacitance values A and D can be changed without changing the transfer function by multiplying the capacitance value D by $\gamma$ (D'=$\gamma$D) as shown in FIG. 7A. In expression (4), if the capacitance value A is multiplied by $\alpha$ (A'=$\alpha$A), the element values of the capacitance values A and B can be changed without changing the transfer function by multiplying the capacitance value B by $\alpha$ (B'=$\alpha$B) as shown in FIG. 7B. In expression (4), if the capacitance value D is multiplied by $\beta$ (D'=$\beta$D), the capacitance values C, D, E, and G can be changed without changing the transfer function by multiplying the capacitance value C by $\beta$ (C' $\beta$C), multiplying the capacitance value E by $\beta$ (E'=$\beta$E), and multiplying the capacitance value G by $\beta$ (G'=$\beta$G) as shown in FIG. 7C.

Then, substituting expression (15) into the capacitance values A, B, C, D, E, and G in expression (4), expression (4) is expressed like expression (16).

$$\begin{aligned} A' &= \alpha \cdot \gamma \cdot A \\ B' &= \alpha \cdot B \\ C' &= \beta \cdot C \\ D' &= \beta \cdot \gamma \cdot D \\ E' &= \beta \cdot E \\ G' &= \beta \cdot G \end{aligned} \quad (15)$$

$$T(z) = \frac{Vout}{Vin} = \frac{\alpha\beta\gamma \cdot A \cdot G \cdot z^{-1} \cdot (1+z^{-1})^2}{4 \cdot \{\alpha\beta\gamma DB + (\alpha\beta\gamma AC + \alpha\beta\gamma AE - 2\alpha\beta\gamma DB) \cdot z^{-1} + (\alpha\beta\gamma BD - \alpha\beta\gamma AE) \cdot z^{-2}\}(C+E-2)} \quad (16)$$

In expression (16), the internal voltage changes since the amounts of electric charge which are stored in capacitors, which form the first LPF 240, and are discharged from the capacitors are different, but the denominator and numerator are divided by $\alpha\beta\gamma$. This means that the transfer function does not affect expression (4). Therefore, the capacitance value of each capacitor which forms the first LPF 240 can be determined according to expression (15).

In expressions (12) to (14), the denominator is common, but it is preferable that G is k times of C and the relationship of G>C (k>1) is satisfied. Moreover, since the Q factor is not so large and T is small, the relationship of E>C is satisfied. Therefore, the area of a capacitor, which forms the first LPF 240, can be suppressed to a minimum by determining other elements with C as the minimum capacitance value. From expression (15), it is preferable to determine the other element values using $\beta$=1.

In this case, the area of the first LPF 240 can be minimized by making the capacitance value A equal to the capacitance value C so that the capacitance value A is also set to the minimum capacitance value. In addition, since manufacturing errors can be suppressed to a minimum by making the capacitance values B and D equal to each other, the area of the first LPF 240 can also be minimized. In this case, $\alpha$ and $\gamma$ have the relationship of the following expression.

$$\alpha = \gamma = \sqrt{C} \quad (17)$$

Accordingly, the capacitance values A, B, C, D, E, and G can be determined as follows.

$$\begin{aligned} A' &= \alpha \cdot \gamma \cdot A = C \\ B' &= \alpha \cdot B = \sqrt{C} \\ C' &= \beta \cdot C = C \\ D' &= \beta \cdot \gamma \cdot D = \sqrt{C} \\ E' &= \beta \cdot E = E \\ G' &= \beta \cdot G = G \end{aligned} \quad (18)$$

Moreover, from expression (18), the relationship of C=B×D is satisfied. Accordingly, assuming that C is 1, it is preferable that B×D has the relationship of the following expression from expression (12).

$$B \cdot D = \frac{\frac{4}{T^2} + \frac{2\omega_0}{TQ} + \omega_0^2}{4\omega_0^2} \quad (19)$$

As described above, it is possible to minimize the area of the first LPF 240 and to determine the element value of an element with a filter function as an LPF. Moreover, since the second LPF 250 also has the same configuration as the first LPF 240, the element value can be determined in the same manner as described above. In this case, by changing only the capacitance value G of the first and second input capacitors C1 and C2 in the second LPF 250 from the capacitance value G of the first and second input capacitors C1 and C2 in the first LPF 240 in order to make the gains different from each other, it is possible to minimize the area of the second LPF 250 and to determine the element value of an element with a filter function as an LPF.

In the present embodiment, the shapes and sizes of the elements of the first and second LPFs 240 and 250 are the same and are manufactured through a common manufacturing process except for the first and second input capacitors C1 and C2, and the capacitance value G of the first and second input capacitors C1 and C2 in the second LPF 250 is set to be larger than the capacitance value G of the first and second input capacitors C1 and C2 in the first LPF 240.

Moreover, since the first and second LPFs 240 and 250 have the same configuration except for the capacitance value G of the first and second input capacitors C1 and C2, there is almost no offset voltage difference between the first operational amplifier OP1 of the first LPF 240 and the second operational amplifier OP2 of the second LPF 250. As a result, since signal processing at the subsequent stage is simplified, a very weak detection signal can also be detected. This is advantageous over the point that the offset voltage increases and 1/f noise becomes accordingly large in a configuration of obtaining two outputs with different gains using one non-inverting amplifier. In addition, this is advantageous over the point that the output load capacities or the filter characteristics are different in a configuration of obtaining two outputs with different gains using two operational amplifiers.

Moreover, as the gain (sensitivity) increases, the capacitance value G becomes large and the total capacitance increases accordingly. As a result, it is possible to reduce noise which is generally expressed as kt/C. That is, in the present embodiment, assuming that the capacitance value C is fixed, the gain can be increased as the capacitance value G increases. Thus, noise of an LPF with a high gain can be further reduced.

In addition, since the output load capacity of the first LPF 240 and the output load capacity of the second LPF 250 are set to be equal, subsequent-stage circuits with the same characteristics can be easily provided. As a result, a detection circuit with high detection accuracy can be provided.

2.4 Others

In the present embodiment, plural capacitors are connected to each other in each of the first and second LPFs 240 and 250. Particularly in an integrated circuit device, an increase in the number of capacitor elements makes highly precise movement control of electric charge difficult due to in-plane capacitance variation. Therefore, even if the number of capacitor elements is increased, it is preferable to realize the same characteristics as designed if possible. For this reason, in the present embodiment, it is preferable that not only the shape and area of each capacitor, which forms the first and second LPFs 240 and 250, are set as follows but also the size of each switch is set as follows.

2.4.1 Shape and Area of a Capacitor and Size of a Switch

Figure 8:
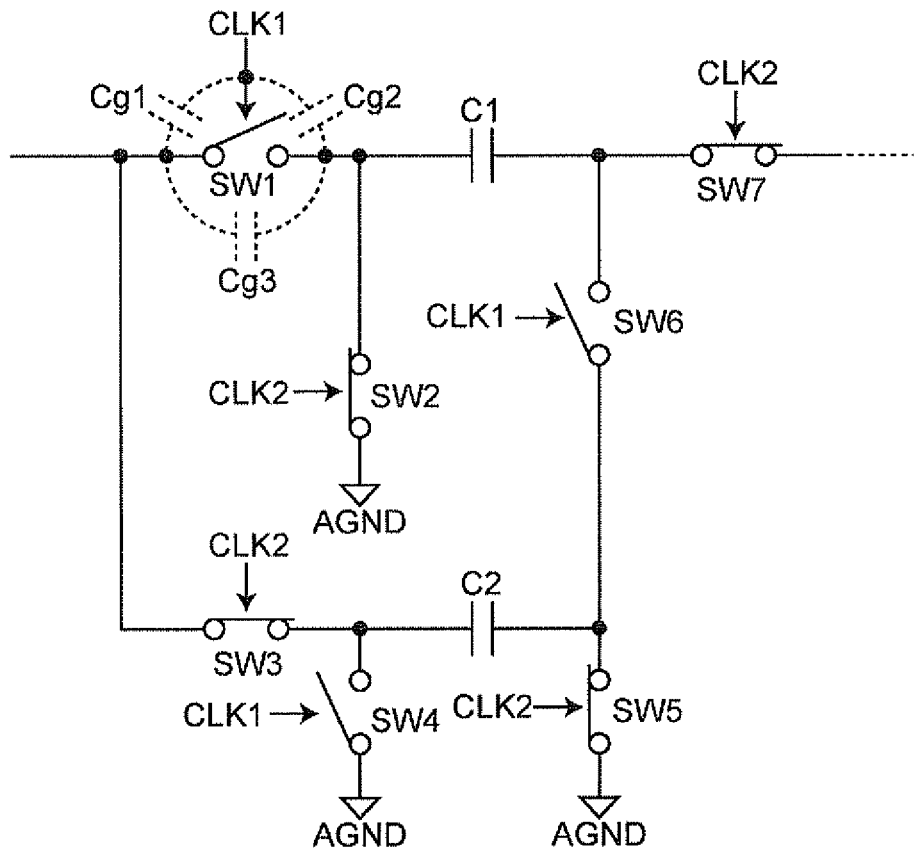
FIG. 8 is a diagram for explaining an example of preferable conditions when forming a first input capacitor circuit shown in FIG. 3.

FIG. 8 is a diagram for explaining an example of preferable conditions when forming the first input capacitor circuit 243 of the first LPF 240 shown in FIG. 3. In FIG. 8, the same sections as in FIG. 3 are denoted by the same reference numerals, and the explanation will be appropriately omitted. In addition, although the first input capacitor circuit 243 is described in FIG. 8, the same is true for the second input capacitor circuit 245 of the first LPF 240 and the first and second input capacitor circuits of the second LPF 250.

In FIG. 8, it is preferable that the shape and area (size) of the first input capacitor C1 are set to be equal to those of the second input capacitor C2. Each of the first and second input capacitors C1 and C2 has a function of transferring stored electric charge to another capacitor according to the state of a switch. When a parasitic capacitance, which is parasitic on such a capacitor and may affect the characteristics of the capacitor, is taken into consideration, it can be said that the ratio of the size of the capacitor formed in the integrated circuit device and the size of its parasitic capacitance is almost constant. Moreover, as disclosed in "Second-order SCF which suppresses the spread of element values" by Ishikawa, Anzai, Fujii, the Institute of Electronics, Information and Communication Engineers of Japan, Technical Report CAS89-163//CS89-123//DSP89-62, it is known that the influence of parasitic capacitance of the above capacitor can be compensated for by neglecting parasitic capacitance Cg1 to Cg3 of a switch.

Therefore, in the present embodiment, it is preferable that the sizes of the first to seventh switches SW1 to SW7 are set to be equal. In this case, the capacitance values of parasitic capacitance connected to the first to seventh switches SW1 to SW7 can be made equal. Even if the parasitic capacitance Cg1 to Cg3 of the switch cannot be neglected, a transfer function of the circuit can be derived, for example, by regarding the characteristics of switches as equal.

Therefore, in the present embodiment, the areas (sizes) of the first and second input capacitors C1 and C2 are set to be equal taking the parasitic capacitance Cg1 to Cg3 of each switch into consideration, so that the influence of the parasitic capacitance of each capacitor can be compensated for and movement control of electric charge can be realized with high precision.

For this reason, in the present embodiment, it is preferable that the shape and area of the first input capacitor C1 are set to be equal to those of the second input capacitor C2 and the first and second input capacitors C1 and C2 are manufactured through a common manufacturing process.

By making equal not only the area (occupied area) of a capacitor but also the shape (for example, the shape of an electrode or the shape of a wiring line connected to an electrode) and having the common manufacturing process, the ratio of the size of a capacitor and the size of its parasitic capacitance can be precisely controlled. As a result, highly precise circuit design becomes possible.

The same is true for the second input capacitor circuit 245, and it is preferable that the sizes of the eighth to fourteenth switches SW8 to SW14 are set to be equal. In this case, the capacitance values of parasitic capacitance connected to the eighth to fourteenth switches SW8 to SW14 can be made equal. Even if the parasitic capacitance Cg1 to Cg3 of the switch cannot be neglected, a transfer function of the circuit can be derived, for example, by regarding the characteristics of switches as equal.

Therefore, in the present embodiment, the areas (sizes) of the third and fourth input capacitors C3 and C4 are set to be equal taking the parasitic capacitance Cg1 to Cg3 of each switch into consideration, so that the influence of parasitic capacitance of each capacitor can be compensated for and movement control of electric charge can be realized with high precision. For this reason, in the present embodiment, it is preferable that the shape and area of the third input capacitor C3 are set to be equal to those of the fourth input capacitor C4 and the third and fourth input capacitors C3 and C4 are manufactured through a common manufacturing process.

For the same reason, it is also preferable that the size of each of the fifteenth to eighteenth switches SW15 to SW18, which form the feedback capacitor circuit 246 shown in FIG. 3, is set to be equal to the size of each of the first to seventh switches SW1 to SW7.

As described above, since the areas (sizes) of the first and second input capacitors C1 and C2 are set to be equal, the sizes of the first to seventh switches SW1 to SW7 are set to be equal, the areas (sizes) of the third and fourth input capacitors C3 and C4 are set to be equal, and the sizes of the eighth to fourteenth switches SW8 to SW14 are set to be equal, it becomes easy to realize the circuit configuration which is so small that the influence of parasitic capacitance can be neglected.

Moreover, as described above, in order to make the capacitance values A and C equal with high precision, it is preferable that the shapes and areas of the third and fourth input capacitors C3 and C4 and the third feedback capacitor Cr3 are set to be equal and the third and fourth input capacitors C3 and C4 and the third feedback capacitor Cr3 are manufactured through a common manufacturing process.

Similarly, in order to make the capacitance values A, B, and D equal with high precision, it is preferable that the shapes and areas of the third and fourth input capacitors C3 and C4 and the first and second feedback capacitor Cr1 and Cr2 are set to be equal and the third and fourth input capacitors C3 and C4 and the first and second feedback capacitor Cr1 and Cr2 are manufactured through a common manufacturing process.

2.4.2 Directivity of a Capacitor

In the present embodiment, it is preferable to set the directivity in consideration of the parasitic capacitance of a capacitor formed in an integrated circuit device.

Figure 9A:
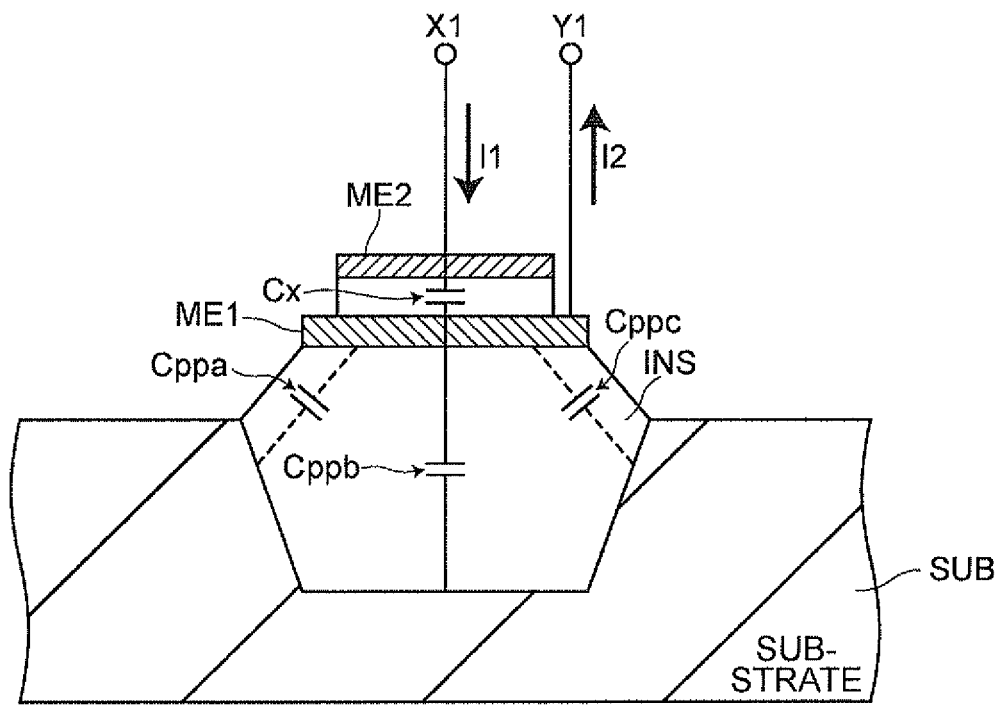
FIGS. 9A and 9B are explanatory views of first and second electrodes.
Figure 9B:
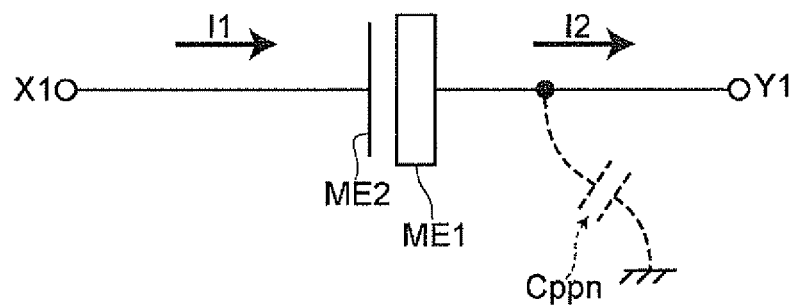

FIGS. 9A and 9B are diagrams for explaining that a first electrode with large parasitic capacitance and a second electrode with small parasitic capacitance exist from the point of view of the structure of a capacitor. FIG. 9A schematically shows the sectional structure of a capacitor formed in an integrated circuit device. FIG. 9B is an explanatory view of a capacitor which forms each of the first and second LPFs 240 and 250.

In FIGS. 9A and 9B, a first electrode ME1 is an electrode to which a large parasitic capacitance is connected, and a second electrode ME2 is an electrode with smaller parasitic capacitance. That is, the second electrode ME2 is at a location which is farther from a substrate (for example, a semiconductor substrate) SUB compared with the first electrode ME1. Accordingly, it is difficult to be influenced by the parasitic capacitance (Cppa, Cppb, Cpcc) caused by the substrate SUB, an insulating layer (field oxide layer or the like) INS formed on the substrate, and the like. In FIG. 9A, Cx indicates a regular capacitance.

Then, in order to distinguish the first electrode ME1 from the second electrode ME2, one capacitor is expressed like FIG. 9B. FIG. 9B shows that a signal at a terminal Y1 connected to the first electrode ME1 tends to be influenced by the parasitic capacitance Cppn.

Figure 10:
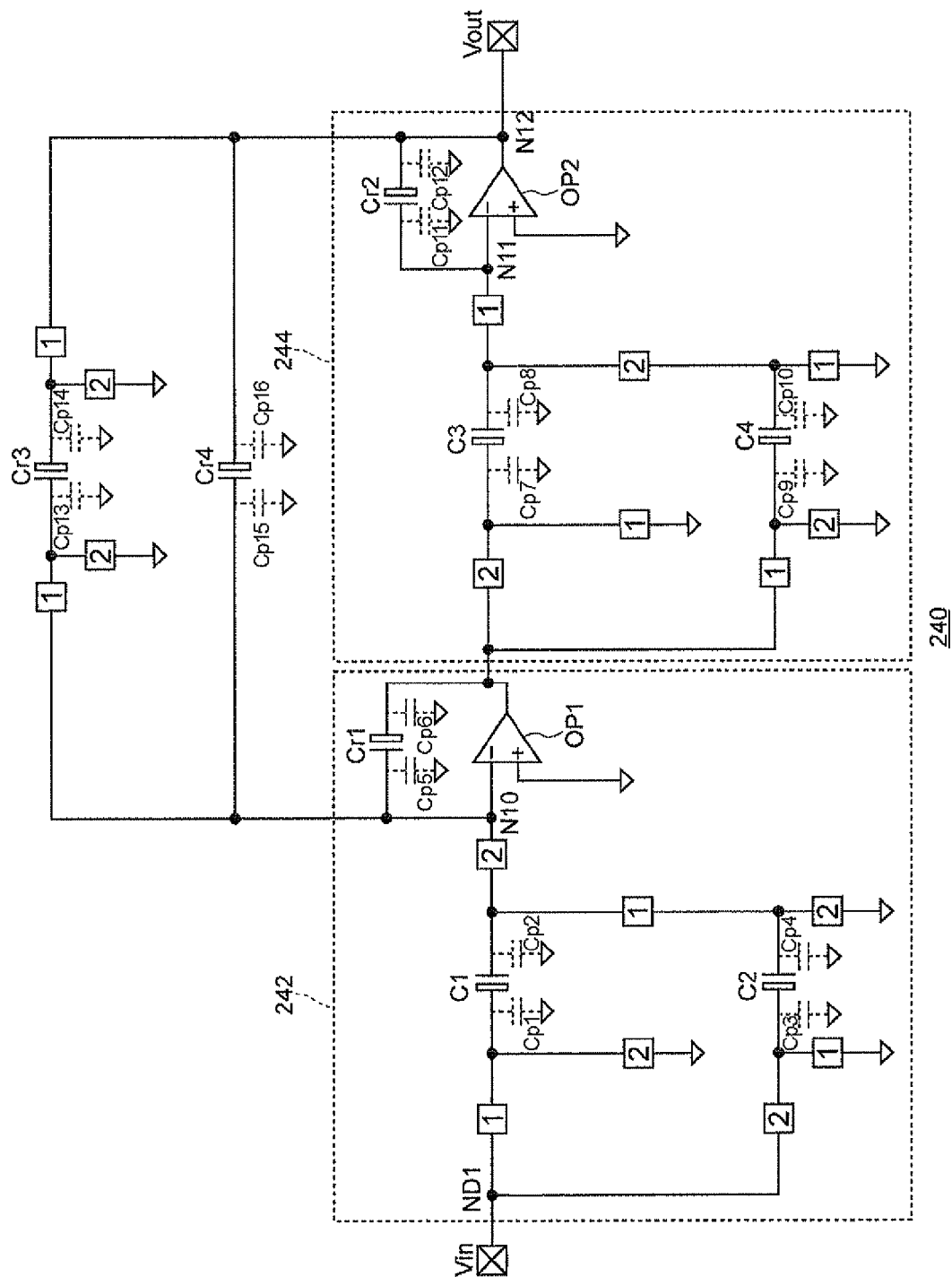
FIG. 10 is a diagram for explaining an example of preferable connection of capacitors in the first LPF.

FIG. 10 is a diagram for explaining an example of preferable connection of capacitors in the first LPF 240. In FIG. 10, the same sections as in FIG. 3 are denoted by the same reference numerals, and the explanation will be appropriately omitted.

Parasitic capacitance Cp1 to Cp6 are virtually connected to the first and second input capacitors C1 and C2 and the first feedback capacitor Cr1. In this case, the electric potential of a node N10, which is an input node of the first operational amplifier OP1/largely influences the amount of electric charge transmitted to first feedback capacitor Cr1. Accordingly, in order to realize the circuit characteristics with high precision, it is preferable that the electric potential is influenced as little as possible by parasitic capacitance.

In addition, parasitic capacitance Cp1 to Cp12 are virtually connected to the third and fourth input capacitors C3 and C4 and the second feedback capacitor Cr2. In this case, the electric potential of a node N11, which is an input node of the second operational amplifier OP2, is largely influenced by the amount of electric charge transmitted to second feedback capacitor Cr2. Accordingly, in order to realize the circuit characteristics with high precision, it is preferable that the electric potential is influenced as little as possible by parasitic capacitance.

In addition, parasitic capacitance Cp13 to Cp16 are virtually connected to the third and fourth feedback capacitors Cr3 and Cr4. In this case, the electric potential of the node N11, which is an input node of the second operational amplifier OP2, and the electric potential of the node N12, which is an output node of the second operational amplifier OP2, largely influence the amount of electric charge discharged from the third and fourth feedback capacitors Cr3 and Cr4. Accordingly, in order to realize the circuit characteristics with high precision, it is preferable that the electric potential is influenced as little as possible by parasitic capacitance.

Therefore, when each capacitor shown in FIG. 10 has the first electrode ME1 provided at the position closer to the substrate and the second electrode ME2 provided at the position far from the substrate, it is preferable that the second electrode ME2 of the first feedback capacitor Cr1 and the second electrode ME2 of the fourth feedback capacitor Cr4 are connected in common to the node N10 which is an input node of the first operational amplifier OP1. In addition, it is preferable that the first electrode ME1 of the second feedback capacitor Cr2 and the first electrode ME1 of the fourth feedback capacitor Cr4 are connected in common to the node N12 which is the output node of the second operational amplifier OP2.

Moreover, also for capacitors connected through a switch, when they are set to have a conductive state by the first phase switch or the second phase switch, it is preferable that each of the first and second input capacitors C1 and C2 and the first and third feedback capacitors Cr1 and Cr3 has a directivity such that the second electrode ME2 of the first input capacitor C1, the second electrode ME2 of the second input capacitor C2, the second electrode ME2 of the first feedback capacitor Cr1, and the second electrode ME2 of the third feedback capacitor Cr3 are connected to each other. In addition, it is preferable that each of the third and fourth input capacitors C3 and C4 and the second feedback capacitor Cr2 has a directivity such that the second electrode ME2 of the third input capacitor C3, the second electrode ME2 of the fourth input capacitor C4, and the second electrode ME2 of the second feedback capacitor Cr2 are connected to each other.

In this way, since the parasitic capacitance Cp2, Cp4, Cp5, Cp13, and Cp15, which may be connected to the node N10 that is an input node of the first operational amplifier OP1, become small, the influences of these parasitic capacitance are suppressed to minimum. As a result, the electric potential of the input node of the first operational amplifier OP1 can be controlled with high precision. In addition, since the parasitic capacitance Cp8, Cp10, and Cp11, which may be connected to the node N11 that is an input node of the second operational amplifier OP2, become small, the influences of these parasitic capacitance are suppressed to a minimum. As a result, the electric potential of the input node of the second operational amplifier OP2 can be controlled with high precision.

On the other hand, a low-impedance node (for example, output nodes of the first and second operational amplifiers OP1 and OP2 or the signal input node ND1) is connected to the first electrode ME1. Accordingly, the parasitic capacitance Cp1, Cp3, Cp6, Cp7, Cp9, Cp12, Cp14, and Cp16, which may be connected to the first electrode ME1 can be neglected without affecting the circuit characteristic.

3. Modifications

In the present embodiment, an example has been described in which the detection circuit 200 performs filtering of a detection signal, which is amplified by the DC amplifier 230, using the first and second LPFs 240 and 250 with different gains and then outputs the signal. However, the present embodiment is not limited thereto.

Figure 11:
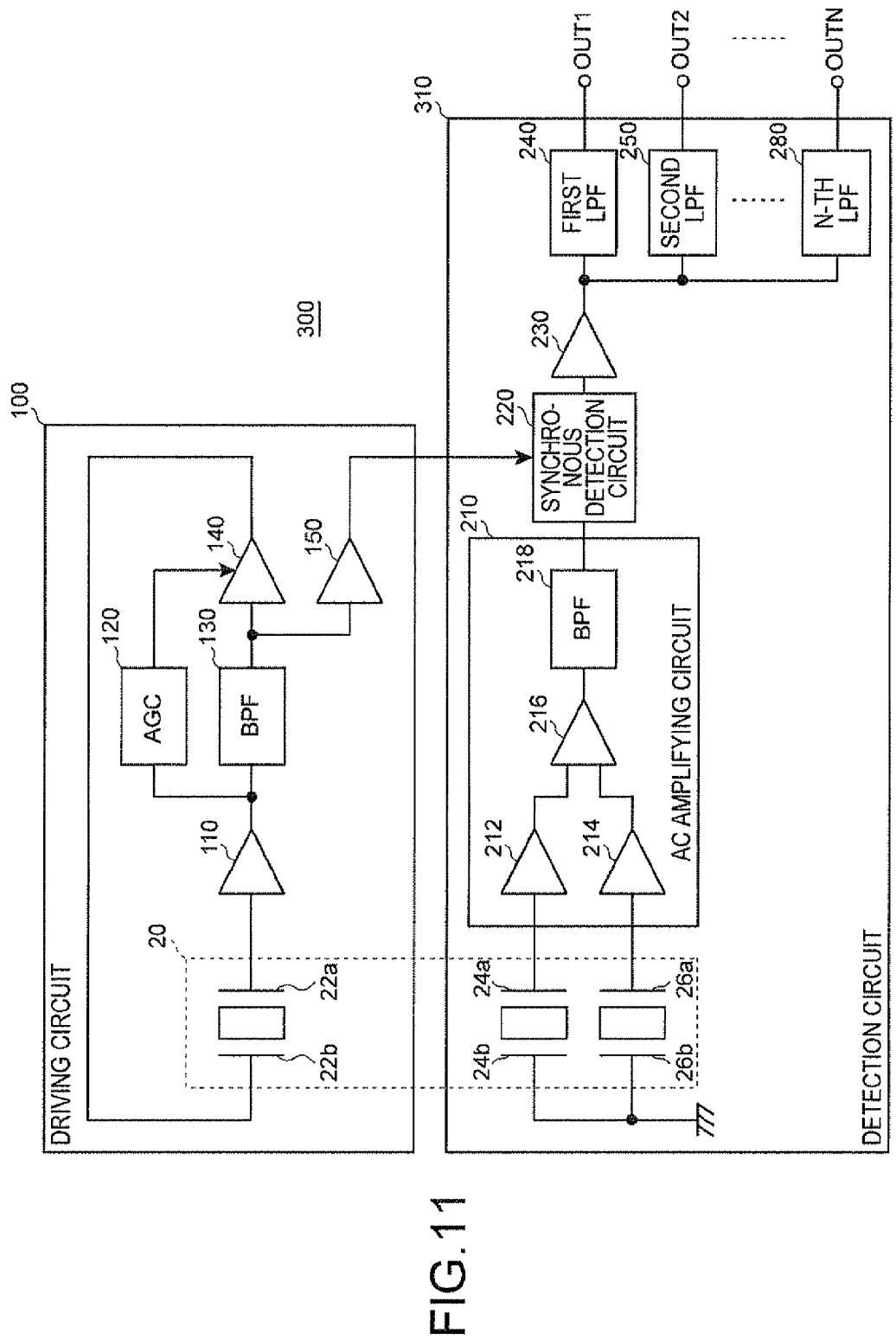
FIG. 11 shows an example of the configuration of a sensor circuit in a modification of the present embodiment.

FIG. 11 shows an example of the configuration of a sensor circuit in a modification of the present embodiment. In FIG. 11, the same sections as in FIG. 1 are denoted by the same reference numerals, and the explanation will be appropriately omitted.

A sensor circuit 300 in this modification is different from the sensor circuit 10 in the present embodiment shown in FIG. 1 in that a detection circuit outputs detection signals OUT1 to OUTN of N types (N is a three or more integer). That is, the sensor circuit 300 includes the driving circuit 100 and a detection circuit 310. In the detection circuit 310, a third LPF to an N-th LPF 280 to which a detection signal amplified by the DC amplifier 230 is input are provided in addition to the configuration of the detection circuit 200 shown in FIG. 1. Each of the third LPF to the N-th LPF 280 outputs detection signals OUTS to OUTN, respectively. Each of the first to N-th LPFs 240 to 280 provided in the detection circuit 310 has the same configuration as the first LPF 240 in the present embodiment, but the gains are different and the output load capacity of each LPF is set equally.

In LPFs with different gains among the first to N-th LPFs 240 to 280 in this modification, only the capacitance values G of the first and second input capacitors C1 and C2 which form a first input capacitor circuit are different as in the present embodiment, but the shapes and sizes of other elements are set to be equal and the output load capacities are also set to be equal by the same means as in the embodiment described above.

Also in this modification, there is almost no offset voltage difference between operational amplifiers of LPFs. As a result, since processing at the subsequent stage is simplified, a very weak detection signal can also be detected. Moreover, as the gain (sensitivity) increases, the capacitance value G becomes large and the total capacitance increases accordingly. As a result, it is possible to reduce noise which is generally expressed as kt/C. In addition, since circuits with the same characteristics can be connected to the subsequent stage of each LPF, it is not necessary to perform signal processing on a detection signal in a state where the characteristics are set differently. As a result, it is possible to improve the detection accuracy at a low cost.

4. Electronic Apparatus

The sensor circuit to which the detection circuit in the present embodiment or the modification is applied can be mounted in an electronic apparatus. Although an example is described below in which the sensor circuit 10 in the present embodiment is mounted in an electronic apparatus, the sensor circuit 300 in the modification is similarly mounted.

Figure 12:
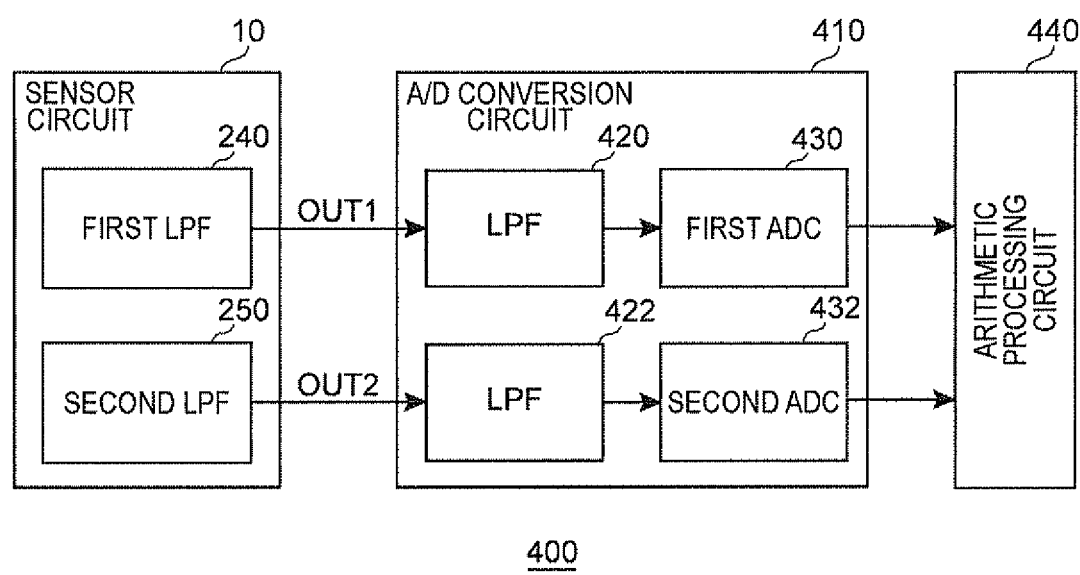
FIG. 12 is a block diagram showing an example of the configuration of an electronic apparatus in the present embodiment.

FIG. 12 is a block diagram showing an example of the configuration of an electronic apparatus in the present embodiment.

An electronic apparatus 400 includes the sensor circuit 10, an A/D conversion circuit 410, and an arithmetic processing circuit 440. The A/D conversion circuit 410 includes LPFs 420 and 422, a first ADC (A/D converter) 430, and a second ADC 432. The detection signal OUT1 output from the first LPF 240 of the sensor circuit 10 is converted into a digital value by the first ADC 430 after a high-frequency component thereof is removed by the LPF 420. The detection signal OUT2 output from the second LPF 250 of the sensor circuit 10 is converted into a digital value by the second ADC 432 after a high-frequency component thereof is removed by the LPF 422. The arithmetic processing circuit 440 calculates the angular velocity and the angle of rotation by performing an integral operation using the digital value from the first ADC 430 or the second ADC 432 according to the amplitude or sensitivity of the detection signal detected by the sensor circuit 10, and executes processing corresponding to the angular velocity or the angle of rotation.

Thus, it is possible to provide an electronic apparatus which performs highly precise processing on a detection signal, which has a large amplitude, with high sensitivity. In addition, since it is not necessary to provide an additional circuit for detection signals with different sensitivities, the costs can be reduced. In addition, since the characteristics of the LPFs 420 and 422 can be made equal, the costs can be reduced.

Figure 13:
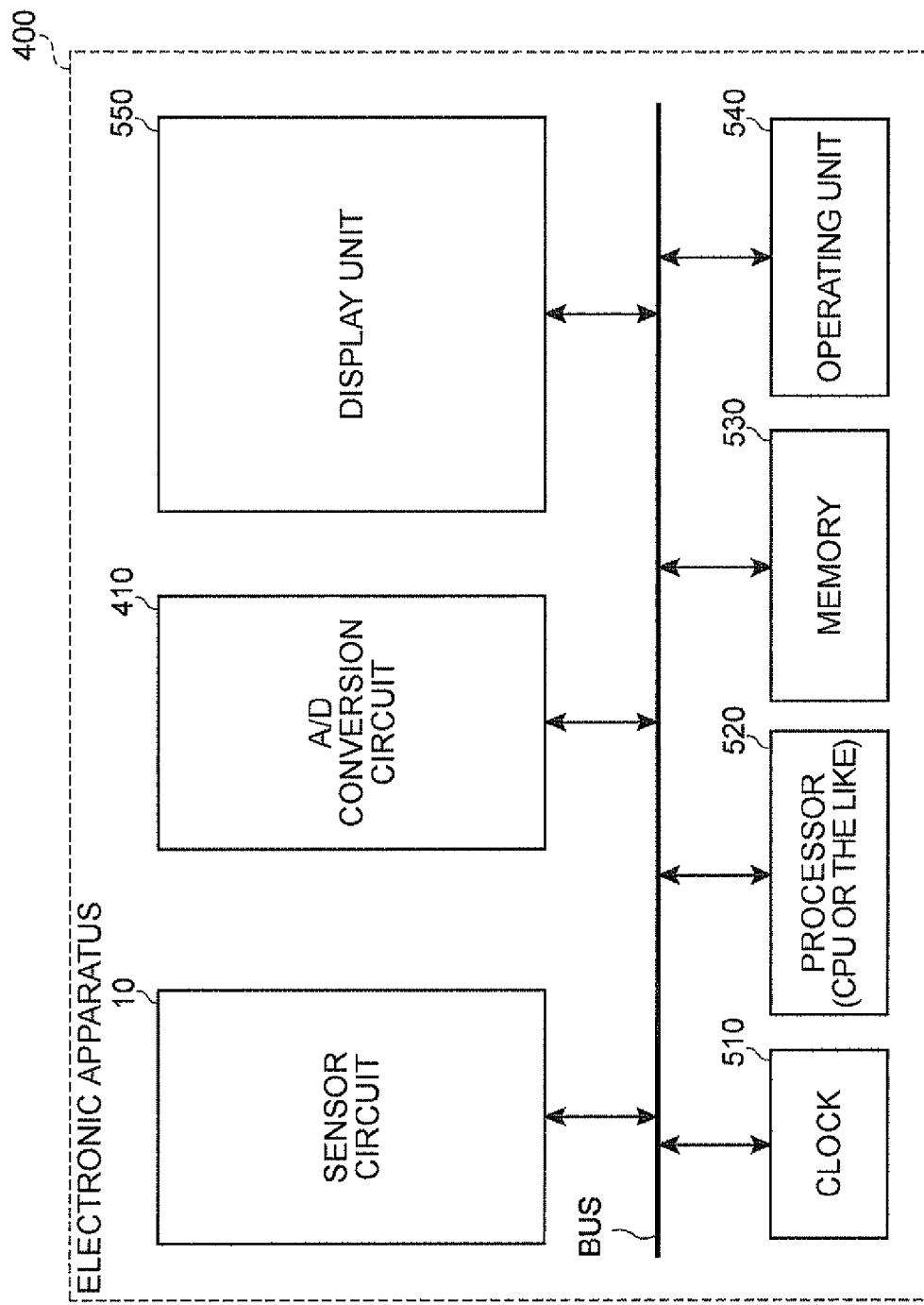
FIG. 13 is a block diagram showing an example of the hardware configuration of the electronic apparatus in the present embodiment.

FIG. 13 is a block diagram showing an example of the hardware configuration of the electronic apparatus 400 in the present embodiment. In FIG. 13, the same sections as in FIG. 12 are denoted by the same reference numerals, and the explanation will be appropriately omitted.

The electronic apparatus 400 has the sensor circuit 10, a display unit 550, a clock generating circuit 510, a processor 520, such as a CPU, a memory 530, and an operating unit 540. The respective units provided in the electronic apparatus 400 are connected to each other through a bus BUS. The arithmetic processing circuit 440 shown in FIG. 12 is realized by the processor 520 which reads a program stored in the memory 530 and executing processing corresponding to the program, for example. In addition, the A/D conversion circuit 410 may be built in the processor 520.

For example, the processor 520 executes processing according to a program read from the memory 530, calculates the angular velocity and the angle of rotation by performing an integral operation using the digital value converted in the A/D conversion circuit 410 according to the amplitude or sensitivity of the detection signal detected by the sensor circuit 10, and executes processing corresponding to the angular velocity or the angle of rotation.

In the present embodiment, there is almost no offset voltage difference between operational amplifiers when outputting two kinds of detection signals with different sensitivities, and a very weak detection signal can also be detected since noise can be further reduced by high-sensitivity output. Accordingly, it is possible to provide an electronic apparatus capable of performing processing on the basis of the small angular velocity. Moreover, since the area of a capacitor which forms the detection circuit 200 can be suppressed to a minimum, a small and high-performance IC can be realized, for example, even if the cut-off frequency is set to a very low frequency (for example, 1 Hz). Accordingly, the electronic apparatus 400 in which this IC is mounted also becomes a small and high-performance electronic apparatus.

Having described the detector, the physical quantity measuring device, and the electronic apparatus of the invention on the basis of the above embodiment and the modification, the invention is not limited to the embodiment and the modification described above, and various modifications thereof may be made within the scope without departing from the subject matter or spirit of the invention. For example, the following modifications may be made.

(1) Fine adjustment of the circuit configuration, for example, changing the switch type or changing the arrangement of elements slightly can be appropriately performed. A MOS transistor switch or other types of switches may also be appropriately used as switches. Therefore, all of these modifications are also included in the invention.

(2) Although the example in which each of the first and second input capacitor circuits 243 and 245 includes two input capacitors has been described in the above embodiment or modification, the invention is not limited thereto. For example, an SC circuit including three or more capacitors may be used as each of the first and second input capacitor circuits 243 and 245.

What is claimed is:

1. A detector that detects a detection signal corresponding to a driving vibration, which excites a vibrator in an oscillation loop, and a physical quantity to be measured, the detector comprising:
   an amplifying circuit that amplifies a signal corresponding to the driving vibration and the physical quantity;
   a synchronous detection circuit that detects the amplified signal of the amplifying circuit in synchronization with an oscillation signal in the oscillation loop;
   an impedance conversion circuit that converts an output impedance of the synchronous detection circuit;
   a first low pass filter to which an output signal of the impedance conversion circuit is supplied and which outputs a first detection signal; and
   a second low pass filter to which the output signal of the impedance conversion circuit is supplied and which outputs a second detection signal, wherein:

each of the first and second low pass filters is formed by a switched capacitor filter circuit,
a gain of the first low pass filter is different from that of the second low pass filter,
an output load capacity of the first low pass filter and an output load capacity of the second low pass filter are set to be equal,
each of the first and second low pass filters includes:
   a first integrator formed by a switched capacitor circuit having a first operational amplifier;
   a second integrator which is formed by a switched capacitor circuit having a second operational amplifier and which is connected to an output end of the first integrator;
   a feedback capacitor circuit having a third feedback capacitor inserted between an output end of the second integrator and a virtual ground end of the first operational amplifier; and
   a fourth feedback capacitor connected in parallel to the feedback capacitor circuit,
   the first integrator includes:
      a first input capacitor circuit connected between an output end of the impedance conversion circuit and the virtual ground end of the first operational amplifier; and
      a first feedback capacitor connected between an output end of the first operational amplifier and the virtual ground end of the first operational amplifier, and
      the first integrator inputs a voltage difference between the output end of the impedance conversion circuit and the virtual ground end of the first operational amplifier and some charges, which are stored by a plurality of capacitors of the first integrator, to the virtual ground end of the first operational amplifier through a switch, and changes an output potential of the first operational amplifier using the first feedback capacitor, and
   the second integrator includes:
      a second input capacitor circuit connected between the output end of the first operational amplifier and a virtual ground end of the second operational amplifier; and
      a second feedback capacitor connected between an output end of the second operational amplifier and the virtual ground end of the second operational amplifier, and
      the second integrator inputs a voltage difference between the output end of the first operational amplifier and the virtual ground end of the second operational amplifier and some charges, which are stored by a plurality of capacitors of the second integrator, to the virtual ground end of the second operational amplifier through a switch, and changes an output potential of the second operational amplifier using the second feedback capacitor.

2. A detector that detects a detection signal corresponding to a driving vibration, which excites a vibrator in an oscillation loop, and a physical quantity to be measured, the detector comprising:
   an amplifying circuit that amplifies a signal corresponding to the driving vibration and the physical quantity;
   a synchronous detection circuit that detects the amplified signal of the amplifying circuit in synchronization with an oscillation signal in the oscillation loop;
   an impedance conversion circuit that converts an output impedance of the synchronous detection circuit;
   a first low pass filter to which an output signal of the impedance conversion circuit is supplied and which outputs a first detection signal; and
   a second low pass filter to which the output signal of the impedance conversion circuit is supplied and which outputs a second detection signal, wherein:
   each of the first and second low pass filters is formed by a switched capacitor filter circuit,
   a gain of the first low pass filter is different from that of the second low pass filter,
   an output load capacity of the first low pass filter and an output load capacity of the second low pass filter are set to be equal,
   each of the first and second low pass filters includes:
   a first input capacitor circuit which has a first input capacitor and a second input capacitor, which is set to have the same capacitance value as the first input capacitor, and to which the output signal of the impedance conversion circuit is supplied;
   a first operational amplifier which amplifies a signal corresponding to an amount of electric charge charged in the first input capacitor circuit;
   a first integrator having a first feedback capacitor inserted between a virtual ground end and an output end of the first operational amplifier;
   a second input capacitor circuit which has a third input capacitor and a fourth input capacitor, which is set to have the same capacitance value as the third input capacitor, and which is connected to the output end of the first operational amplifier;
   a second operational amplifier which amplifies a signal corresponding to an amount of electric charge charged in the second input capacitor circuit;
   a second integrator having a second feedback capacitor inserted between a virtual ground end and an output end of the second operational amplifier;
   a feedback capacitor circuit having a third feedback capacitor which is formed so as to be able to be inserted between an output end of the second integrator and the virtual ground end of the first operational amplifier; and
   a fourth feedback capacitor connected in parallel to the feedback capacitor circuit,
   the first input capacitor circuit transfers electric charge, which is charged in the second input capacitor in synchronization with a second clock with a phase opposite to a phase of a first clock, to the first input capacitor in synchronization with the first clock and transfers electric charge, which is charged in the first input capacitor, to the first feedback capacitor in synchronization with the second clock,
   the second input capacitor circuit transfers electric charge, which is charged in the fourth input capacitor in synchronization with the first clock, to the third input capacitor in synchronization with the second clock and transfers electric charge, which is charged in the third input capacitor, to the second feedback capacitor in synchronization with the first clock, and
   the feedback capacitor circuit is inserted between the output end of the second integrator and the virtual ground end of the first operational amplifier in synchronization with the first clock, and discharges electric charge, which is charged in the third feedback capacitor, in synchronization with the second clock.

3. The detector according to claim 2,
wherein the first input capacitor circuit includes:
a first switch inserted between a signal input node, to which the output signal of the impedance conversion circuit is supplied, and one end of the first input capacitor;
a second switch inserted between the one end of the first input capacitor and a reference potential;
a third switch inserted between the signal input node and one end of the second input capacitor;
a fourth switch inserted between the one end of the second input capacitor and the reference potential;
a fifth switch inserted between the other end of the second input capacitor and the reference potential;
a sixth switch inserted between the other end of the second input capacitor and the other end of the first input capacitor; and
a seventh switch inserted between the other end of the first input capacitor and the virtual ground end of the first operational amplifier,
the second input capacitor circuit includes:
an eighth switch inserted between a connection node, to which the output of the first operational amplifier is supplied, and one end of the third input capacitor;
a ninth switch inserted between the one end of the third input capacitor and the reference potential;
a tenth switch inserted between the connection node and one end of the fourth input capacitor;
an eleventh switch inserted between the one end of the fourth input capacitor and the reference potential;
a twelfth switch inserted between the other end of the fourth input capacitor and the reference potential;
a thirteenth switch inserted between the other end of the fourth input capacitor and the other end of the third input capacitor; and
a fourteenth switch inserted between the other end of the third input capacitor and the virtual ground end of the second operational amplifier, and
the feedback capacitor circuit includes:
a fifteenth switch inserted between the virtual ground end of the first operational amplifier and one end of the third feedback capacitor;
a sixteenth switch inserted between the one end of the third feedback capacitor and the reference potential;
a seventeenth switch inserted between the other end of the third feedback capacitor and the reference potential; and
an eighteenth switch inserted between the other end of the third feedback capacitor and the output end of the second operational amplifier.

4. The detector according to claim 3,
wherein each of the first, fourth, sixth, ninth, tenth, twelfth, fourteenth, fifteenth, and eighteenth switches is switching-controlled by the first clock, and
each of the second, third, fifth, seventh, eighth, eleventh, thirteenth, sixteenth, and seventeenth switches is switching-controlled by the second clock.

5. The detector according to claim 2,
wherein shapes and areas of the second, third, and fourth feedback capacitors in each of the first and second low pass filters are set to be equal, and the second, third, and fourth feedback capacitors in each of the first and second low pass filters are manufactured through a common manufacturing process.

6. The detector according to claim 2,
wherein shapes and areas of the third and fourth input capacitors and the third feedback capacitor are set to be equal, and the third and fourth input capacitors and the third feedback capacitor are manufactured through a common manufacturing process.

7. The detector according to claim 2,
wherein a ratio of a capacitance value of the first input capacitor and a capacitance value of the third feedback capacitor in the first low pass filter is set to be different from a ratio of a capacitance value of the first input capacitor and a capacitance value of the third feedback capacitor in the second low pass filter.

8. The detector according to claim 7,
wherein the capacitance value of the third feedback capacitor in the first low pass filter is set to be equal to the capacitance value of the third feedback capacitor in the second low pass filter, and
the capacitance value of the first input capacitor in the first low pass filter is different from the capacitance value of the first input capacitor in the second low pass filter.

9. The detector according to claim 8,
wherein the first and second low pass filters, shapes and areas of elements which form each low pass filter are set to be equal except for the capacitance values of the first and second input capacitors in each low pass filter.

10. The detector according to claim 2,
wherein assuming that a frequency of each of the first and second clocks is T, a Q factor of the first low pass filter is Q, a capacitance value of the third feedback capacitor is 1, and ω is a cut-off frequency on the s plane, a capacitance value D of the first feedback capacitor and a capacitance value B of the second feedback capacitor have relationship expressed as follows, $$B \cdot D = \frac{\frac{4}{T^2} + \frac{2\omega_0}{TQ} + \omega_0^2}{4\omega_0^2} \quad \left(\text{where, } \omega_0 = \frac{2}{T}\tan\frac{\omega T}{2}\right).$$

11. The detector according to claim 2,
wherein each of the first and second clocks in the first low pass filter has the same phase and frequency as each of the first and second clocks in the second low pass filter.

12. The detector according to claim 1,
wherein the physical quantity is angular velocity.

13. A physical quantity measuring device comprising:
a driving circuit which forms an oscillation loop together with a vibrator and excites the vibrator to perform a driving vibration; and
the detector according to claim 1,
wherein the driving circuit outputs a reference signal, which is obtained by binarizing the oscillation signal, to the detector, and
the synchronous detection circuit detects the amplified signal in synchronization with the reference signal.

14. An electronic apparatus comprising the detector according to claim 1.

15. An electronic apparatus comprising the physical quantity measuring device according to claim 13.

* * * * *